US010367131B2

(12) United States Patent
Kasichainula

(10) Patent No.: US 10,367,131 B2
(45) Date of Patent: Jul. 30, 2019

(54) EXTENDED AREA OF SPUTTER DEPOSITED N-TYPE AND P-TYPE THERMOELECTRIC LEGS IN A FLEXIBLE THIN-FILM BASED THERMOELECTRIC DEVICE

(71) Applicant: Sridhar Kasichainula, Fremont, CA (US)

(72) Inventor: Sridhar Kasichainula, Fremont, CA (US)

(*) Notice: Subject to any disclaimer, the term of this patent is extended or adjusted under 35 U.S.C. 154(b) by 0 days.

(21) Appl. No.: 15/995,110

(22) Filed: May 31, 2018

(65) Prior Publication Data

US 2018/0277732 A1 Sep. 27, 2018

Related U.S. Application Data

(63) Continuation-in-part of application No. 15/869,017, filed on Jan. 11, 2018, which is a continuation of
(Continued)

(51) Int. Cl.
*H01L 21/00* (2006.01)
*H01L 35/34* (2006.01)
(Continued)

(52) U.S. Cl.
CPC .......... *H01L 35/34* (2013.01); *H01L 31/0547* (2014.12); *H01L 35/08* (2013.01);
(Continued)

(58) Field of Classification Search
CPC ..... H01L 31/0547; H01L 35/08; H01L 35/30; H01L 35/32; H01L 35/34; H02S 30/20; H02S 40/44
See application file for complete search history.

(56) References Cited

U.S. PATENT DOCUMENTS 3,081,361 A 3/1963 Henderson et al.
3,197,342 A 7/1965 Neild, Jr.
(Continued)

FOREIGN PATENT DOCUMENTS

CN 1505252 A 6/2004
CN 1975448 A 6/2007
(Continued)

OTHER PUBLICATIONS

"Evaluating Energy-Harvesting Technologies for Wearable Designs", Article Library, Contributed by Publitek Marketing Communications, Dec. 3, 2014 by European Editors (pp. 4) http://www.digkey.com/en/articles/techzone/2014/dec/evaluating-energy-harvesting-technologies-for-wearable-designs.
(Continued)

*Primary Examiner* — Richard A Booth
(74) *Attorney, Agent, or Firm* — LegalForce RAPC Worldwide

(57) ABSTRACT

A method includes forming a thin-film based thermoelectric module by sputter depositing pairs of N-type and P-type thermoelectric legs electrically in contact with one another on corresponding electrically conductive pads on a flexible substrate having a dimensional thickness less than or equal to 25 μm, with the legs having extended areas compared to the corresponding electrically conductive pads, and rendering the formed thin-film based thermoelectric module flexible and less than or equal to 100 μm in dimensional thickness based on choices of fabrication processes. The method also includes encapsulating the formed thin-film based thermoelectric module with an elastomer to render the flexibility thereto. The elastomer encapsulation has a dimensional thickness less than or equal to 15 μm, and the flexibility enables an array of thin-film based thermoelectric modules to be completely wrappable and bendable around a
(Continued)

system element from which the array is configured to derive thermoelectric power.

20 Claims, 16 Drawing Sheets

Related U.S. Application Data application No. 15/808,902, filed on Nov. 10, 2017, which is a continuation-in-part of application No. 14/564,072, filed on Dec. 8, 2014, and a continuation-in-part of application No. 14/711,810, filed on May 14, 2015, now Pat. No. 10,141,492, and a continuation-in-part of application No. 15/368,683, filed on Dec. 5, 2016.

(60) Provisional application No. 61/912,561, filed on Dec. 6, 2013.

(51) Int. Cl.
*H01L 35/32* (2006.01)
*H01L 35/08* (2006.01)
*H01L 31/054* (2014.01)
*H02S 10/10* (2014.01)
*H01L 35/30* (2006.01)
*H02S 40/44* (2014.01)
*H02S 30/20* (2014.01)

(52) U.S. Cl.
CPC .............. *H01L 35/30* (2013.01); *H01L 35/32* (2013.01); *H02S 10/10* (2014.12); *H02S 30/20* (2014.12); *H02S 40/44* (2014.12); *Y02E 10/52* (2013.01)

(56) References Cited

U.S. PATENT DOCUMENTS

| | | |
|---|---|---|
| 3,458,356 A | 7/1969 | Kummer et al. |
| 3,508,968 A | 4/1970 | Ovshinsky |
| 3,554,815 A | 1/1971 | Osborn |
| 3,618,590 A | 11/1971 | Frank et al. |
| 3,648,152 A | 3/1972 | Low |
| 3,666,566 A | 5/1972 | Flaherty |
| 3,851,381 A | 12/1974 | Alais et al. |
| 3,995,429 A | 12/1976 | Peters |
| 4,036,665 A | 7/1977 | Barr et al. |
| 4,039,352 A | 8/1977 | Marinescu |
| 4,095,998 A | 6/1978 | Hanson |
| 4,106,279 A | 8/1978 | Martin et al. |
| 4,125,122 A | 11/1978 | Stachurski |
| 4,213,292 A | 7/1980 | Dolezal et al. |
| 4,251,291 A | 2/1981 | Gomez |
| 4,338,560 A | 7/1982 | Lemley |
| 4,382,154 A | 5/1983 | Thery et al. |
| 4,443,650 A | 4/1984 | Takagi et al. |
| 4,448,028 A | 5/1984 | Chao et al. |
| 4,467,611 A | 8/1984 | Nelson et al. |
| 4,497,973 A | 2/1985 | Heath et al. |
| 4,551,857 A | 11/1985 | Galvin |
| 4,571,448 A * | 2/1986 | Barnett ............... H01L 31/1804 136/256 |
| 4,574,160 A * | 3/1986 | Cull .................. H01L 31/02008 136/244 |
| 4,673,863 A | 6/1987 | Swarbrick |
| 4,946,511 A | 8/1990 | Shiloh et al. |
| 5,180,928 A | 1/1993 | Choi |
| 5,286,304 A | 2/1994 | Macris et al. |
| 5,419,780 A | 5/1995 | Suski |
| 5,427,086 A | 6/1995 | Brownell |
| 5,521,375 A | 5/1996 | Jang |
| 5,554,819 A | 9/1996 | Baghai-Kermani |
| 5,563,368 A | 10/1996 | Yamaguchi |
| 5,625,245 A | 4/1997 | Bass |
| 5,705,770 A | 1/1998 | Ogasawara et al. |
| 5,712,448 A | 1/1998 | Vandersande et al. |
| 5,817,188 A | 10/1998 | Yahatz et al. |
| 5,889,735 A | 3/1999 | Kawata et al. |
| 5,892,656 A | 4/1999 | Bass |
| 5,929,372 A | 7/1999 | Oudoire et al. |
| 5,950,067 A | 9/1999 | Maegawa et al. |
| 5,959,240 A | 9/1999 | Yoshida et al. |
| 6,043,423 A | 3/2000 | Satomura et al. |
| 6,066,902 A | 5/2000 | Maurio et al. |
| 6,075,199 A | 6/2000 | Wong |
| 6,166,317 A | 12/2000 | Volk, Jr. |
| 6,207,887 B1 | 3/2001 | Bass et al. |
| 6,271,459 B1 | 8/2001 | Yoo |
| 6,281,594 B1 | 8/2001 | Sarich |
| 6,300,150 B1 | 10/2001 | Venkatasubramanian |
| 6,304,520 B1 | 10/2001 | Watanabe |
| 6,307,142 B1 | 10/2001 | Allen et al. |
| 6,313,393 B1 | 11/2001 | Trost |
| 6,314,741 B1 | 11/2001 | Hiraishi |
| 6,320,280 B1 | 11/2001 | Kanesaka |
| 6,329,217 B1 | 12/2001 | Watanabe et al. |
| 6,367,261 B1 | 4/2002 | Marshall et al. |
| 6,407,965 B1 | 6/2002 | Matoge et al. |
| 6,410,971 B1 | 6/2002 | Otey |
| 6,426,921 B1 | 7/2002 | Mitamura |
| 6,433,465 B1 | 8/2002 | McKnight et al. |
| 6,548,894 B2 | 4/2003 | Chu et al. |
| 6,598,405 B2 | 7/2003 | Bell |
| 6,605,773 B2 | 8/2003 | Kok et al. |
| 6,620,994 B2 | 9/2003 | Rossi |
| 6,700,310 B2 | 3/2004 | Maue et al. |
| 6,729,183 B2 | 5/2004 | Tanimoto et al. |
| 6,846,983 B1 | 1/2005 | Warehime |
| 6,870,766 B2 | 3/2005 | Cho et al. |
| 6,882,128 B1 | 4/2005 | Rahmel et al. |
| 6,914,343 B2 | 7/2005 | Hiller et al. |
| 7,081,693 B2 | 7/2006 | Hamel et al. |
| 7,282,384 B2 | 10/2007 | Shin et al. |
| 7,360,365 B2 | 4/2008 | Codecasa et al. |
| 7,397,169 B2 | 7/2008 | Nersessian et al. |
| 7,400,050 B2 | 7/2008 | Jovanovic et al. |
| 7,488,888 B2 | 2/2009 | Mitchell et al. |
| 7,493,766 B2 | 2/2009 | Yang et al. |
| 7,532,937 B2 | 5/2009 | Horio et al. |
| 7,649,139 B2 | 1/2010 | Mihara et al. |
| 7,770,645 B2 | 8/2010 | Jeffryes |
| 7,777,126 B2 | 8/2010 | Chu |
| 7,800,194 B2 | 9/2010 | Freedman |
| 7,800,278 B2 | 9/2010 | Ujihara et al. |
| 7,834,263 B2 | 11/2010 | DeSteese et al. |
| 7,851,691 B2 | 12/2010 | DeSteese et al. |
| 7,851,932 B2 | 12/2010 | Rome et al. |
| 7,878,283 B2 | 2/2011 | Richter et al. |
| 7,939,743 B2 | 5/2011 | Leng et al. |
| 8,046,993 B2 | 11/2011 | Kao |
| 8,216,871 B2 | 7/2012 | McCann |
| 8,237,043 B2 | 8/2012 | Kondoh |
| 8,269,097 B2 | 9/2012 | Asatani et al. |
| 8,269,098 B2 | 9/2012 | Chu |
| 8,294,020 B2 | 10/2012 | Mitchell et al. |
| 8,404,959 B2 | 3/2013 | Donley |
| 8,404,960 B2 | 3/2013 | Prather et al. |
| 8,421,313 B2 | 4/2013 | Shih et al. |
| 8,421,403 B2 | 4/2013 | Newman |
| 8,519,505 B2 | 8/2013 | Hiroshige et al. |
| 8,519,595 B2 | 8/2013 | Hunter et al. |
| 8,594,803 B2 | 11/2013 | Magdych |
| 8,604,571 B2 | 12/2013 | Uchida et al. |
| 8,653,357 B2 | 2/2014 | Prather et al. |
| 8,685,758 B2 | 4/2014 | Suzuki et al. |
| 8,777,441 B2 | 7/2014 | Vazquez |
| 8,802,964 B2 | 8/2014 | Meng et al. |
| 8,948,870 B2 | 2/2015 | Imran |
| 8,952,235 B2 | 2/2015 | Span et al. |
| 8,975,503 B2 | 3/2015 | Mitchell et al. |
| 9,215,905 B2 | 12/2015 | Tseng |
| 9,224,936 B2 | 12/2015 | Nakamura et al. |

(56) References Cited

U.S. PATENT DOCUMENTS

| | | |
|---|---|---|
| 9,431,593 B2 | 8/2016 | Kato et al. |
| 9,455,390 B2 | 9/2016 | Kurihara et al. |
| 2002/0047489 A1 | 4/2002 | Oudakker |
| 2002/0117198 A1 | 8/2002 | Kok et al. |
| 2002/0148235 A1 | 10/2002 | Bell |
| 2003/0223919 A1 | 12/2003 | Kwak et al. |
| 2004/0045594 A1 | 3/2004 | Hightower |
| 2004/0094192 A1 | 5/2004 | Luo |
| 2004/0183306 A1 | 9/2004 | Rome |
| 2004/0238022 A1 | 12/2004 | Hiller et al. |
| 2005/0000559 A1 | 1/2005 | Horio et al. |
| 2005/0022855 A1 | 2/2005 | Raver |
| 2005/0087222 A1 | 4/2005 | Muller-Werth |
| 2005/0115600 A1 | 6/2005 | DeSteese et al. |
| 2005/0139248 A1 | 6/2005 | Strnad |
| 2005/0139250 A1 | 6/2005 | DeSteese et al. |
| 2005/0205125 A1 | 9/2005 | Nersessian et al. |
| 2005/0236028 A1 | 10/2005 | Strnad |
| 2006/0048807 A1 | 3/2006 | Lee et al. |
| 2006/0107990 A1 | 5/2006 | Adachi et al. |
| 2006/0118157 A1 | 6/2006 | Johnson et al. |
| 2006/0130888 A1 | 6/2006 | Yamaguchi et al. |
| 2006/0201161 A1 | 9/2006 | Hirai et al. |
| 2006/0207643 A1 | 9/2006 | Weaver et al. |
| 2006/0208492 A1 | 9/2006 | Jovanovic et al. |
| 2006/0243317 A1 | 11/2006 | Venkatasubramanian |
| 2006/0254638 A1 | 11/2006 | Carmeli et al. |
| 2007/0000068 A1 | 1/2007 | Gerard France et al. |
| 2007/0028956 A1 | 2/2007 | Venkatasubramanian et al. |
| 2007/0056622 A1 | 3/2007 | Leng et al. |
| 2007/0095379 A1 | 5/2007 | Taher et al. |
| 2007/0125413 A1 | 6/2007 | Olsen et al. |
| 2007/0193617 A1 | 8/2007 | Taguchi |
| 2007/0283702 A1 | 12/2007 | Strnad |
| 2007/0290287 A1 | 12/2007 | Freedman |
| 2008/0017238 A1 | 1/2008 | Fei et al. |
| 2008/0065172 A1 | 3/2008 | Magdych |
| 2008/0066796 A1 | 3/2008 | Mitchell et al. |
| 2008/0092937 A1 | 4/2008 | Mitchell et al. |
| 2008/0173537 A1 | 7/2008 | DeSteese et al. |
| 2008/0264464 A1 | 10/2008 | Lee et al. |
| 2008/0283110 A1 | 11/2008 | Jin et al. |
| 2009/0000652 A1 | 1/2009 | von Windheim et al. |
| 2009/0025773 A1 | 1/2009 | Stark |
| 2009/0217960 A1 | 9/2009 | Tubel et al. |
| 2009/0260358 A1 | 10/2009 | Rapp et al. |
| 2009/0315335 A1 | 12/2009 | Ujihara et al. |
| 2010/0063557 A1 | 3/2010 | Imran |
| 2010/0065096 A1 | 3/2010 | Pellegrini |
| 2010/0154855 A1 | 6/2010 | Nemir et al. |
| 2010/0186399 A1 | 7/2010 | Huttinger |
| 2010/0257871 A1 | 10/2010 | Venkatasubramanian et al. |
| 2010/0300504 A1 | 12/2010 | Ceron Parisi et al. |
| 2010/0319745 A1 | 12/2010 | Meng et al. |
| 2011/0084349 A1 | 4/2011 | Uchida et al. |
| 2011/0139398 A1 | 6/2011 | Bauer et al. |
| 2011/0140458 A1 | 6/2011 | Arnold et al. |
| 2011/0169372 A1 | 7/2011 | Lim |
| 2011/0220162 A1 | 9/2011 | Siivola et al. |
| 2012/0000500 A1 | 1/2012 | Iida et al. |
| 2012/0081066 A1 | 4/2012 | Newman |
| 2012/0160290 A1 | 6/2012 | Chen et al. |
| 2012/0192910 A1 | 8/2012 | Fowler et al. |
| 2012/0227779 A1 | 9/2012 | Miao et al. |
| 2012/0291425 A1 | 11/2012 | Mitchell et al. |
| 2012/0312343 A1 | 12/2012 | VanVechten et al. |
| 2013/0019460 A1 | 1/2013 | Mayes |
| 2013/0021002 A1 | 1/2013 | Mayes |
| 2013/0021788 A1 | 1/2013 | Mayes |
| 2013/0087180 A1 | 4/2013 | Stark et al. |
| 2013/0206199 A1 | 8/2013 | Lassiter et al. |
| 2013/0249301 A1 | 9/2013 | Smoot et al. |
| 2013/0298957 A1 | 11/2013 | Hiroshige et al. |
| 2014/0015470 A1 | 1/2014 | Lim et al. |
| 2014/0020728 A1 | 1/2014 | Chung |
| 2014/0090150 A1 | 4/2014 | Skertic |
| 2014/0096810 A1 | 4/2014 | Nakamura et al. |
| 2014/0137917 A1 | 5/2014 | Al-Merbati et al. |
| 2014/0159637 A1 | 6/2014 | Ebersold |
| 2014/0246066 A1 | 9/2014 | Chen et al. |
| 2014/0299169 A1 | 10/2014 | Schneider et al. |
| 2014/0326287 A1 | 11/2014 | Wiant et al. |
| 2014/0345666 A1 | 11/2014 | Konnai et al. |
| 2014/0348453 A1 | 11/2014 | Bartl et al. |
| 2014/0360548 A1 | 12/2014 | Bartl et al. |
| 2014/0373888 A1 | 12/2014 | Boukai et al. |
| 2014/0375246 A1 | 12/2014 | Boysen, III et al. |
| 2015/0048249 A1 | 2/2015 | Hedler et al. |
| 2015/0162517 A1 | 6/2015 | Kasichainula |
| 2015/0188019 A1 | 7/2015 | Corrado et al. |
| 2015/0214823 A1 | 7/2015 | Shastry et al. |
| 2015/0282227 A1 | 10/2015 | Yousef et al. |
| 2015/0324181 A1 | 11/2015 | Segal |
| 2016/0006123 A1 | 1/2016 | Li et al. |
| 2016/0233402 A1 | 8/2016 | Suda et al. |
| 2016/0336501 A1 | 11/2016 | Kasichainula |
| 2017/0012195 A1 | 1/2017 | Grishin |

FOREIGN PATENT DOCUMENTS

| | | |
|---|---|---|
| CN | 101454914 A | 6/2009 |
| CN | 201739025 U | 2/2011 |
| CN | 201781448 U | 3/2011 |
| CN | 201830182 U | 5/2011 |
| CN | 202005376 U | 10/2011 |
| CN | 102629842 A | 8/2012 |
| CN | 202602564 U | 12/2012 |
| CN | 102891635 A | 1/2013 |
| CN | 202651208 U | 1/2013 |
| CN | 202713203 U | 1/2013 |
| CN | 202978757 U | 6/2013 |
| CN | 203086385 U | 7/2013 |
| CN | 203119810 U | 8/2013 |
| CN | 103325935 A | 9/2013 |
| CN | 103534826 A | 1/2014 |
| CN | 204168184 U | 2/2015 |
| CN | 104638742 A | 5/2015 |
| CN | 103178754 B | 7/2015 |
| CN | 204669251 U | 9/2015 |
| DE | 2355863 A1 | 5/1974 |
| DE | 3735410 A1 | 5/1989 |
| DE | 3807633 A1 | 9/1989 |
| DE | 4118979 A1 | 12/1992 |
| DE | 4208358 A1 | 9/1993 |
| DE | 4313627 A1 | 11/1994 |
| DE | 19732399 A1 | 2/1999 |
| DE | 19919023 A1 | 12/2000 |
| DE | 10004390 C2 | 5/2002 |
| DE | 10112383 B4 | 1/2004 |
| DE | 29724918 U1 | 8/2006 |
| DE | 102006014414 A1 | 10/2007 |
| DE | 102006039024 A1 | 2/2008 |
| DE | 102006057662 A1 | 6/2008 |
| DE | 102008030758 A1 | 1/2009 |
| DE | 102008005334 A1 | 7/2009 |
| DE | 102008009979 A1 | 9/2009 |
| DE | 202010003713 U1 | 7/2010 |
| DE | 202010011515 U1 | 11/2010 |
| DE | 102008031266 B4 | 5/2013 |
| DE | 102007017461 B4 | 4/2014 |
| EP | 0117743 A3 | 11/1986 |
| EP | 0644599 A2 | 3/1995 |
| EP | 0935334 A2 | 8/1999 |
| EP | 0993117 A3 | 2/2002 |
| EP | 2764268 B1 | 8/2015 |
| JP | 2003102186 A | 4/2003 |
| JP | 3447915 B2 | 9/2003 |
| JP | 2005228160 A | 8/2005 |
| JP | 2006086510 A | 3/2006 |
| JP | 2013225550 A | 10/2013 |
| JP | 3196069 U | 2/2015 |
| KR | 20160109658 A | 9/2016 |
| WO | 1985005406 A1 | 12/1985 |
| WO | 1989007836 A1 | 8/1989 |

(56) References Cited

FOREIGN PATENT DOCUMENTS

| | | |
|---|---|---|
| WO | 1995030246 A1 | 11/1995 |
| WO | 1997045882 A1 | 12/1997 |
| WO | 1999007024 A1 | 2/1999 |
| WO | 1999010937 A1 | 3/1999 |
| WO | 2001082343 A2 | 11/2001 |
| WO | 2003007391 A1 | 1/2003 |
| WO | 2003015186 A2 | 2/2003 |
| WO | 2005086246 A2 | 9/2005 |
| WO | 2005098225 A1 | 10/2005 |
| WO | 2006003956 A1 | 1/2006 |
| WO | 2006001827 A3 | 4/2006 |
| WO | 2006110858 A2 | 10/2006 |
| WO | 2008013584 A2 | 1/2008 |
| WO | 2008025701 A2 | 3/2008 |
| WO | 2008095582 A1 | 8/2008 |
| WO | 2008134022 A2 | 11/2008 |
| WO | 2007142934 A3 | 12/2008 |
| WO | 2009045662 A3 | 11/2009 |
| WO | 2009151000 A1 | 12/2009 |
| WO | 2010048066 A2 | 4/2010 |
| WO | 2010101049 A1 | 9/2010 |
| WO | 2010113257 A1 | 10/2010 |
| WO | 2010138835 A2 | 12/2010 |
| WO | 2011091620 A1 | 8/2011 |
| WO | 2012130568 A1 | 10/2012 |
| WO | 2012165990 A1 | 12/2012 |
| WO | 2013050415 A1 | 4/2013 |
| WO | 2013108518 A1 | 7/2013 |
| WO | 2013109729 A1 | 7/2013 |
| WO | 2013135447 A1 | 9/2013 |
| WO | 2014064755 A1 | 5/2014 |
| WO | 2014082028 A1 | 5/2014 |
| WO | 2015045500 A1 | 4/2015 |
| WO | 2015103483 A1 | 7/2015 |
| WO | 2015126272 A1 | 8/2015 |
| WO | 2015148411 A1 | 10/2015 |
| WO | 2015164903 A1 | 11/2015 |
| WO | 2015193177 A2 | 12/2015 |
| WO | 2015193634 A1 | 12/2015 |
| WO | 2016003482 A1 | 1/2016 |
| WO | 2016147918 A1 | 9/2016 |

OTHER PUBLICATIONS

"Energy Harvesting Moves into Wearable Electronics", Article Library, Contributed by Publitek Marketing Communications, Feb. 15, 2012 by European Editors (pp. 5) http://www.digikey.com/en/articles/techzone/2012/feb/energy-harvesting-moves-into-wearable-electronics.

"Top 5 Energy Harvesting Options for Wearable Devices", Avnet, 2016 by James C. Hess (pp. 2) http://www.em.avnet.com/en-us/design/technical-articles/Pages/Articles/Top-5-Energy-Harvesting-Options-for-Wearable-Devices.aspx.

"Review of Energy Harvesting Techniques and Applications for Microelectronics", Polytechnic University of Catalonia, Department of Electronic Engineering Barcelona, Spain, 2005 by Loreto Mateu et al. (p. 1) http://upcommons.upc.edu/handle/2117/613?locale-attribute=en.

"Energy Harvesting Technology Can Be the Wave of the Future", Wearable Technologies Conference, San Fransisco, Jul. 13, 2015 by by Spela Kosir (pp. 8) https://www.wearable-technologies.com/2015/07/energy-harvesting-technology-can-be-the-wave-of-the-future/.

"Thermoelectric Energy Harvesting 2014-2024: Devices, Applications, Opportunities", IDTechEx by Dr Harry Zervos (pp. 3) http://www.idtechex.com/research/reports/thermoelectric-energy-harvesting-2014-2024-devices-applications-opportunities-000392.asp.

"TEGwear™ Technology", Perpetua—Renewable Energy Solutions for Wireless Sensors, 2015 (p. 1) http://www.pepetuapower.com/technology.htm.

"Thin-film Thermoelectric—Energy Harvesting for Internet of Things", Thermogen, 2016 (pp. 4) http://www.thermogentech.com/#services.

"Thermoelectric Fabrics: Toward Power Generating Clothing", Scientific Reports 5, Article No. 6411, Mar. 23, 2015 by Yong Du et al. (pp. 15) http://www.nature.com/articles/srep06411.

"Energy harvesting for assistive and mobile applications", Energy Science and Engineering, vol. 3, Issue 3, Feb. 17, 2015 by Vikrant Bhatnagar et al. (pp. 14) http://onlinelibrary.wiley.com/doi/10.1002/ese3.63/full.

"A Shoe-Embedded Piezoelectric Energy Harvester for Wearable Sensors", Sensors, Jul. 11, 2014 by Jingjing Zhao et al. (pp. 9) http://www.ncbi.nlm.nih.gov/pmc/articles/PMC4168512/.

"Energy Harvesting Peltier Ring", HackADay, Feb. 2, 2016 by James Hobson (p. 1) http://hackaday.com/2013/12/02/energy-harvesting-peltier-ring/.

"Recharging Batteries using Energy Harvested from Thermal Gradients", Journal of Intelligent Material Systems and Structures, Department of Mechanical Engineering, Michigan Technological University, Jan. 2007 by Henry A. Sodano et al. (p. 1) http://jim.sagepub.com/content/18/1/3.short.

"Flexible Thin-film Thermoelectric Generator Inserting cr Buffer Layer", National Institute of Advanced Industrial Science and Technology, Dec. 2, 2012 by M. Mizoshiri et al. (pp. 4) http://cap.ee.ic.ac.uk/~pdm97/powermems/2012/poster/P-058.pdf.

"Miniaturized Thermoelectric Power Sources", 34th Intersociety Energy Conversion Engineering Conference Proc., Vancouver, BC, Canada, 1999 by J. P. Fleurial et al. (pp. 5) http://www.thermoelectrics.caltech.edu/publications/pdf/IECEC-992569-Paper.pdf.

"Flexible Thermoelectric Materials and Device Optimization for Wearable Energy Harvesting", Journal of Materials Chemistry C, Materials for optical, magnetic and electronic devices, Issue 40, Jul. 1, 2015 by Je-Hyeong Bahk et al. (p. 1) http://pubs.rsc.org/en/Content/ArticleLanding/2015/TC/c5tc01644d#!divAbstract.

"Thick-film Thermoelectric Microdevices", IEEE Xplore, Sep. 2, 1999 by J. P. Fleurial et al. (pp. 2) http://ieeexplore.ieee.org/xpl/login.jsp?tp=&arnumber=843388&url=http%3A%2F%2Fieeexplore.ieee.org%2Fiel5%2F6791%2F18227%2F00843338.pdf%3Farnumber%3D843388.

"Thermoelectric Microconverter for Energy Harvesting Systems", Industrial Electronics, IEEE, Oct. 20, 2009 by J. P. Carmo et al. (pp. 2) http://ieeexplore.ieee.org/xpl/login.jsp?tp=&amumber=5290158&url=http%3A%2F%2Fieeexplore.ieee.org%2Fxpls%2Fabs_all.jsp%3Farnumber%3D5290158.

"New Micro Thermoelectric Devices Based on Bismuth Telluride-type Thin Solid Films", IEEE Xplore, Sep. 2, 1999 by Stark et al. (pp. 2) http://ieeexplore.ieee.org/xpl/iogin.jsp?tp=&arnumber=843432&url=http%3A%2F%2Fieeexplore.ieee.org%2Fxpls%2Fabs_all.jsp%3Farnumber%3D843432.

"Modelling and Experimental Verification of a Ge/SiGe Thermoelectric Generator", IEEE Xplore, Jul. 2, 2015 by A. Odia et al. (pp. 2) http://ieeexplore.ieee.org/xpl/articleDetails.jsp?arnumber=7251383&queryText=voltage%20generating%20thermoelectric%20device&newsearch=true.

"Thermoelectric Power Generator Design and Selection from TE Cooling Module Specifications", IEEE Xplore, Aug. 29, 1997 by R.J. Buist et al. (pp. 2) http://ieeexplore.ieee.org/xpl/articleDetails.jsp?arnumber=667589&queryText=voltage%20generating%20thermoelectric%20device&newsearch=true.

"A Dual Mode Thermoelectric Energy Harvesting Circuit Using Transformer-Based Boost Converter, Charge pump and Time-domain Digital Control", IEEE Xplore, Jun. 20, 2014 by Ying-Khai Teh et al. (pp. 2) http://ieeexplore.ieee.org/xpl/articleDetails.jsp?arnumber=7061101&queryText=voltage%20generating%20thermoelectric%20device&pageNumber=2&newsearch=true&searchField=Search_All.

"Power Generation of Thermoelectric Oxide Modules", IEEE Xplore, Jun. 23, 2005 by R. Funahashi et al. (pp. 2) http://ieeexplore.ieee.org/xpl/articleDetails.jsp?arnumber=1519947&queryText=voltage%20generating%20thermoelectric%20device&pageNumber=2&newsearch=true&searchField=Search_All.

"Nonlinear Anisotropic Thermoelectric Energy Converter Based on Semiconductor Films", IEEE Xplore, Aug. 21, 2003 by L.P. Bulat (pp. 2) http://ieeexplore.ieee.org/xpl/articleDetails.jsp?arnumber=

(56) References Cited

OTHER PUBLICATIONS

1287525&queryText=voltage%20generating%20thermoelectric%20device&pageNumber=2&newsearch=true&searchField=Search_All.

"Thermoelectric Generator for Heat Meter", IEEE Xplore, 2001 by Xiaoguang Liu et al. (pp. 2) http://ieeexplore.ieee.erg/xpl/articleDetails.jsp?arnumber=979920&queryText=voltage%20generating%20thermoelectric%20device&pageNumber=2&newsearch=true&searchField=Search_All.

"Mixed Thick-/Thin Film Thermoelectric Microgenerators", IEEE Xplore, Sep. 4, 2008 by P. Markowski et al. (pp. 2) http://ieeexplore.ieee.org/xpl/articleDetails.jsp?arnumber=468419&queryText=voltage%20generating%20thermoelectric%20device&pageNumber=2&newsearch=true&searchField=Search_All.

\* cited by examiner

THERMOELECTRIC
DEVICE
1200

EXTENDED AREA OF SPUTTER DEPOSITED N-TYPE AND P-TYPE THERMOELECTRIC LEGS IN A FLEXIBLE THIN-FILM BASED THERMOELECTRIC DEVICE

CLAIM OF PRIORITY

This application is a continuation-in-part application of co-pending U.S. application Ser. No. 15/869,017 titled FLEXIBLE ENCAPSULATION OF A FLEXIBLE THIN-FILM BASED THERMOELECTRIC DEVICE WITH SPUTTER DEPOSITED LAYER OF N-TYPE AND P-TYPE THERMOELECTRIC LEGS filed on Jan. 11, 2018, co-pending U.S. application Ser. No. 15/808,902 titled FLEXIBLE THIN-FILM BASED THERMOELECTRIC DEVICE WITH SPUTTER DEPOSITED LAYER OF N-TYPE AND P-TYPE THERMOELECTRIC LEGS filed on Nov. 10, 2017, co-pending U.S. application Ser. No. 14/564,072 titled VOLTAGE GENERATION ACROSS TEMPERATURE DIFFERENTIALS THROUGH A THERMOELECTRIC LAYER COMPOSITE filed on Dec. 8, 2014, which is a conversion application of U.S. Provisional Application No. 61/912,561 also titled VOLTAGE GENERATION ACROSS TEMPERATURE DIFFERENTIALS THROUGH A THERMOELECTRIC LAYER COMPOSITE filed on Dec. 6, 2013, co-pending U.S. application Ser. No. 14/711,810 titled ENERGY HARVESTING FOR WEARABLE TECHNOLOGY THROUGH A THIN FLEXIBLE THERMOELECTRIC DEVICE filed on May 14, 2015, and co-pending U.S. application Ser. No. 15/368,683 titled PIN COUPLING BASED THERMOELECTRIC DEVICE filed on Dec. 5, 2016. The contents of the aforementioned applications are incorporated by reference in entirety thereof.

FIELD OF TECHNOLOGY

This disclosure relates generally to thermoelectric devices and, more particularly, to extended area of sputter deposited N-type and P-type thermoelectric legs in a flexible thin-film based thermoelectric device.

BACKGROUND

A thermoelectric device may be formed from alternating N and P elements/legs made of semiconducting material on a rigid substrate (e.g., alumina) joined on a top thereof to another rigid substrate/plate (e.g., again, alumina). In a typical bulk thermoelectric module/device, N-type thermoelectric legs and P-type thermoelectric legs may be bookended by top and bottom metal traces. Because of the typical long length of said N-type thermoelectric legs and P-type thermoelectric legs, there is no shunting during soldering of the metal traces.

However, as the height of the N-type thermoelectric legs and the P-type thermoelectric legs reduce in thin-film based thermoelectric devices, the top metal trace(s) may shunt the bottom metal trace(s) during deposition thereof.

SUMMARY

Disclosed are methods, a device and/or a system of extended area of sputter deposited N-type and P-type thermoelectric legs in a flexible thin-film based thermoelectric device.

In one aspect, a method of a thin-film based thermoelectric module includes forming the thin-film based thermoelectric module by sputter depositing pairs of N-type thermoelectric legs and P-type thermoelectric legs electrically in contact with one another on corresponding electrically conductive pads on a flexible substrate such that an area of each sputter deposited N-type thermoelectric leg and another area of each sputter deposited P-type thermoelectric leg is more than an area of the corresponding electrically conductive pad to allow for extension thereof outside the corresponding electrically conductive pad. The flexible substrate is an aluminum (Al) foil, a sheet of paper, teflon, plastic, a single-sided copper (Cu) clad laminate sheet, or a double-sided Cu clad laminate sheet, and the flexible substrate has a dimensional thickness less than or equal to 25 μm.

The method also includes rendering the formed thin-film based thermoelectric module flexible and less than or equal to 100 μm in dimensional thickness based on choices of fabrication processes with respect to layers of the formed thin-film based thermoelectric module including the sputter deposited N-type thermoelectric legs and the P-type thermoelectric legs, and encapsulating the formed thin-film based thermoelectric module with an elastomer to render the flexibility thereto. The elastomer encapsulation has a dimensional thickness less than or equal to 15 μm, and the flexibility enables an array of thin-film based thermoelectric modules, each of which is equivalent to the thin-film based thermoelectric module formed on the flexible substrate with the elastomer encapsulation, to be completely wrappable and bendable around a system element from which the array of the thin-film based thermoelectric modules is configured to derive thermoelectric power.

A layer of the formed thin-film based thermoelectric module including the sputter deposited N-type thermoelectric legs and the P-type thermoelectric legs has a dimensional thickness less than or equal to 25 μm.

In another aspect, a method of a thin-film based thermoelectric module includes forming the thin-film based thermoelectric module by sputter depositing pairs of N-type thermoelectric legs and P-type thermoelectric legs electrically in contact with one another on corresponding electrically conductive pads on a flexible substrate such that an area of each sputter deposited N-type thermoelectric leg and another area of each sputter deposited P-type thermoelectric leg is more than an area of the corresponding electrically conductive pad to allow for extension thereof outside the corresponding electrically conductive pad. The flexible substrate is an Al foil, a sheet of paper, teflon, plastic, a single-sided Cu clad laminate sheet, or a double-sided Cu clad laminate sheet, and the flexible substrate has a dimensional thickness less than or equal to 25 μm.

The method also includes rendering the formed thin-film based thermoelectric module flexible and less than or equal to 100 μm in dimensional thickness based on choices of fabrication processes with respect to layers of the formed thin-film based thermoelectric module including the sputter deposited N-type thermoelectric legs and the P-type thermoelectric legs. A layer of the formed thin-film based thermoelectric module including the sputter deposited N-type thermoelectric legs and the P-type thermoelectric legs has a dimensional thickness less than or equal to 25 μm.

Further, the method includes encapsulating the formed thin-film based thermoelectric module with an elastomer to render the flexibility thereto, and wrapping and bending an array of thin-film based thermoelectric modules, each of which is equivalent to the thin-film based thermoelectric module formed on the flexible substrate with the elastomer encapsulation, completely around a system element from which the array of the thin-film based thermoelectric modules is configured to derive thermoelectric power in accordance with the flexibility thereof. The elastomer encapsulation has a dimensional thickness less than or equal to 15 μm.

In yet another aspect, a method of a thin-film based thermoelectric device includes forming the thin-film based thermoelectric device out of an array of thermoelectric modules, each of which is less than or equal to 100 μm in dimensional thickness and is formed by sputter depositing pairs of N-type thermoelectric legs and P-type thermoelectric legs electrically in contact with one another on corresponding electrically conductive pads on a flexible substrate such that an area of each sputter deposited N-type thermoelectric leg and another area of each sputter deposited P-type thermoelectric leg is more than an area of the corresponding electrically conductive pad to allow for extension thereof outside the corresponding electrically conductive pad. The flexible substrate is an Al foil, a sheet of paper, teflon, plastic, a single-sided Cu clad laminate sheet, or a double-sided Cu clad laminate sheet, and the flexible substrate has a dimensional thickness less than or equal to 25 μm.

A layer of the each thermoelectric module including the sputter deposited N-type thermoelectric legs and the P-type thermoelectric legs has a dimensional thickness less than or equal to 25 μm. The method also includes rendering the formed thin-film based thermoelectric device flexible based on choices of fabrication processes with respect to layers of the each thermoelectric module including the sputter deposited N-type thermoelectric legs and the P-type thermoelectric legs, and encapsulating the each thermoelectric module of the formed thin-film based thermoelectric device with an elastomer to render the flexibility thereto. The elastomer encapsulation has a dimensional thickness less than or equal to 15 μm, and the flexibility enables the formed thin-film based thermoelectric device to be completely wrappable and bendable around a system element from which the formed thin-film based thermoelectric device is configured to derive thermoelectric power.

Other features will be apparent from the accompanying drawings and from the detailed description that follows.

BRIEF DESCRIPTION OF THE DRAWINGS

The embodiments of this invention are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

Example embodiments, as described below, may be used to provide methods, a device and/or a system of extended area of sputter deposited N-type and P-type thermoelectric legs in a flexible thin-film based thermoelectric device. Although the present embodiments have been described with reference to specific example embodiments, it will be evident that various modifications and changes may be made to these embodiments without departing from the broader spirit and scope of the various embodiments.

Figure 1:
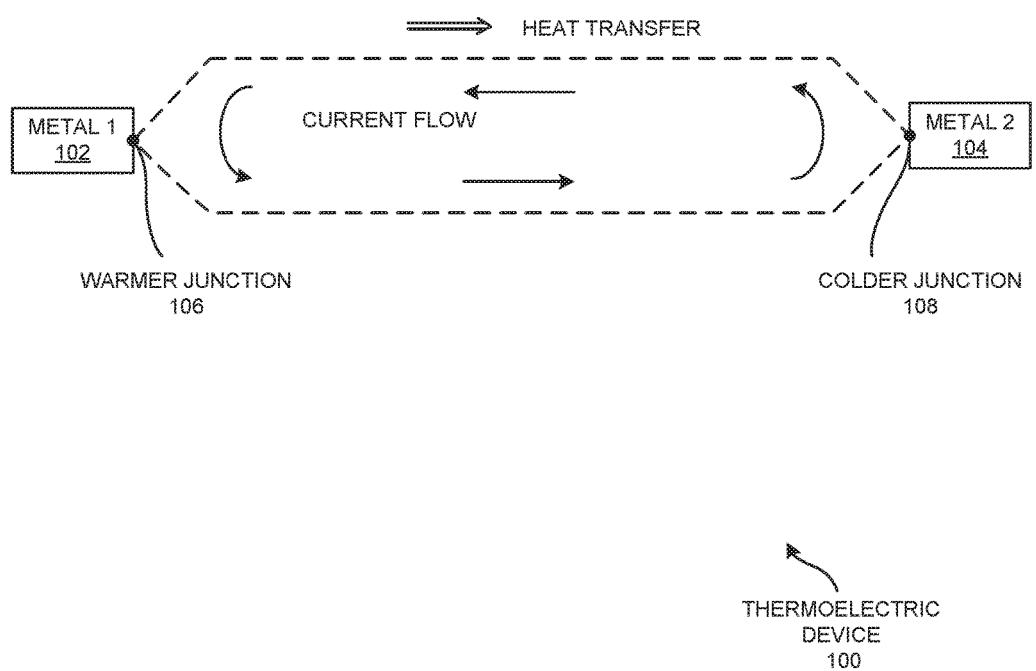
FIG. 1 is a schematic view of a thermoelectric device.

FIG. 1 shows a thermoelectric device 100. Thermoelectric device 100 may include different metals, metal 1 102 and metal 2 104, forming a closed circuit. Here, a temperature difference between junctions of said dissimilar metals leads to energy levels of electrons therein shifted in a dissimilar manner. This results in a potential/voltage difference between the warmer (e.g., warmer junction 106) of the junctions and the colder (e.g., colder junction 108) of the junctions. The aforementioned conversion of heat into electricity at junctions of dissimilar metals is known as Seebeck effect.

The most common thermoelectric devices in the market may utilize alternative P and N type legs/pellets/elements made of semiconducting materials. As heat is applied to one end of a thermoelectric device based on P and N type elements, charge carriers thereof may be released into the conduction band. Electron (charge carrier) flow in the N type element may contribute to a current flowing from the end (hot end) where the heat is applied to the other end (cold end). Hole (charge carrier) flow in the P type element may contribute to a current flowing from the other end (cold end) to the end (hot end) where the heat is applied. Here, heat may be removed from the cold end to prevent equalization of charge carrier distribution in the semiconductor materials due to migration thereof.

Figure 2:
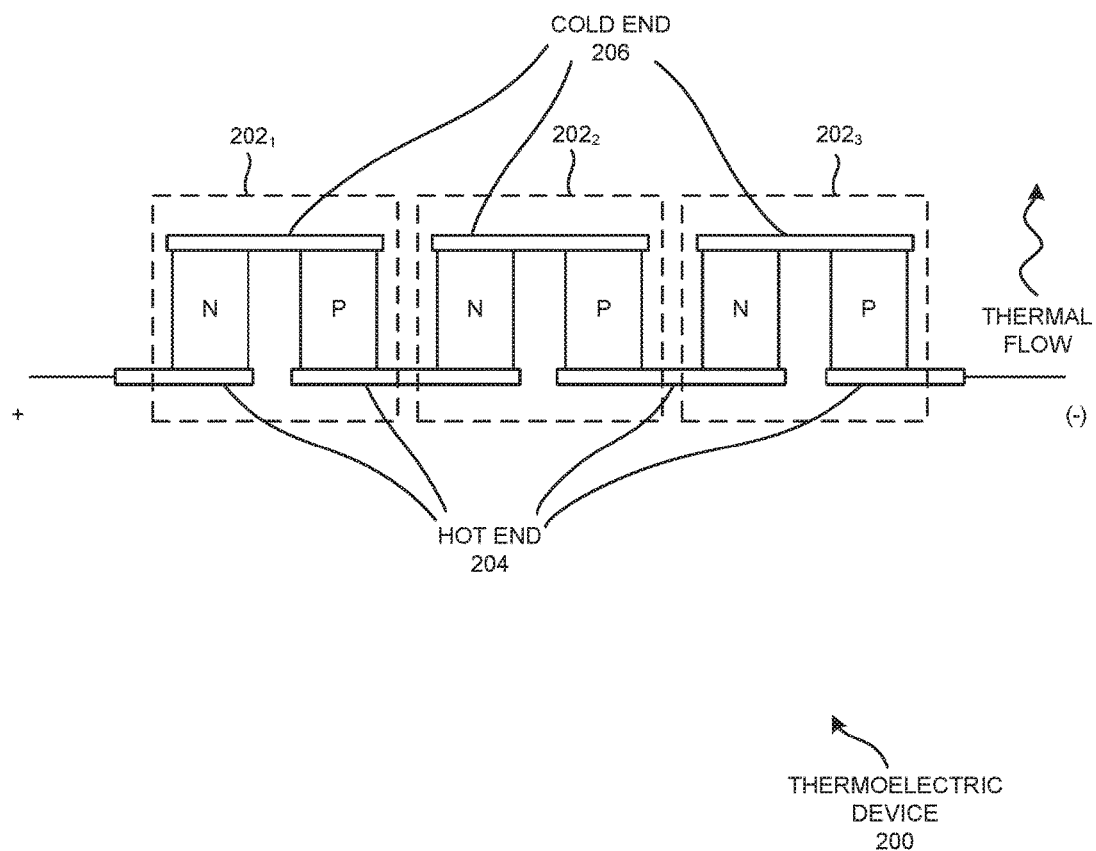
FIG. 2 is a schematic view of an example thermoelectric device with alternating P and N elements.

In order to generate voltage at a meaningful level to facilitate one or more application(s), typical thermoelectric devices may utilize alternating P and N type elements (legs/pellets) electrically coupled in series (and thermally coupled in parallel) with one another, as shown in FIG. 2. FIG. 2 shows an example thermoelectric device 200 including three alternating P and N type elements $202_{1-3}$. The hot end (e.g., hot end 204) where heat is applied and the cold end (e.g., cold end 206) are also shown in FIG. 2.

Typical thermoelectric devices (e.g., thermoelectric device 200) may be limited in application thereof because of rigidity, bulkiness and high costs (>$20/watt) associated therewith. Also, these devices may operate at high temperatures using active cooling. Exemplary embodiments discussed herein provide for a thermoelectric platform (e.g., enabled via roll-to-roll sputtering on a flexible substrate (e.g., plastic)) that offers a large scale, commercially viable, high performance, easy integration and inexpensive (<20 cents/watt) route to flexible thermoelectrics.

In accordance with the exemplary embodiments, P and N thermoelectric legs may be deposited on a flexible substrate (e.g., plastic) using a roll-to-roll process that offers scalability and cost savings associated with the N and P materials. In a typical solution, bulk legs may have a height in millimeters (mm) and an area in $mm^2$. In contrast, N and P bulk legs described in the exemplary embodiments discussed herein may have a height in microns (μm) and an area in the $μm^2$ to $mm^2$ range.

Examples of flexible substrates may include but are not limited to aluminum (Al) foil, a sheet of paper, teflon, plastic and a single/double-sided copper (Cu) clad laminate sheet. As will be discussed below, exemplary embodiments involve processes for manufacturing/fabrication of thermoelectric devices/modules that enable flexibility thereof not only in terms of substrates but also in terms of thin films/thermoelectric legs/interconnects/packaging. Preferably, exemplary embodiments provide for thermoelectric devices/modules completely wrappable and bendable around other devices utilized in specific applications, as will be discussed below. Further, exemplary embodiments provide for manufactured/fabricated thermoelectric devices/modules that are each less than or equal to 100 μm in dimensional thickness. Although exemplary embodiments discuss thermoelectric devices in general, it is clear that the aforementioned thermoelectric devices are preferably thin-film based thermoelectric devices.

Figure 3:
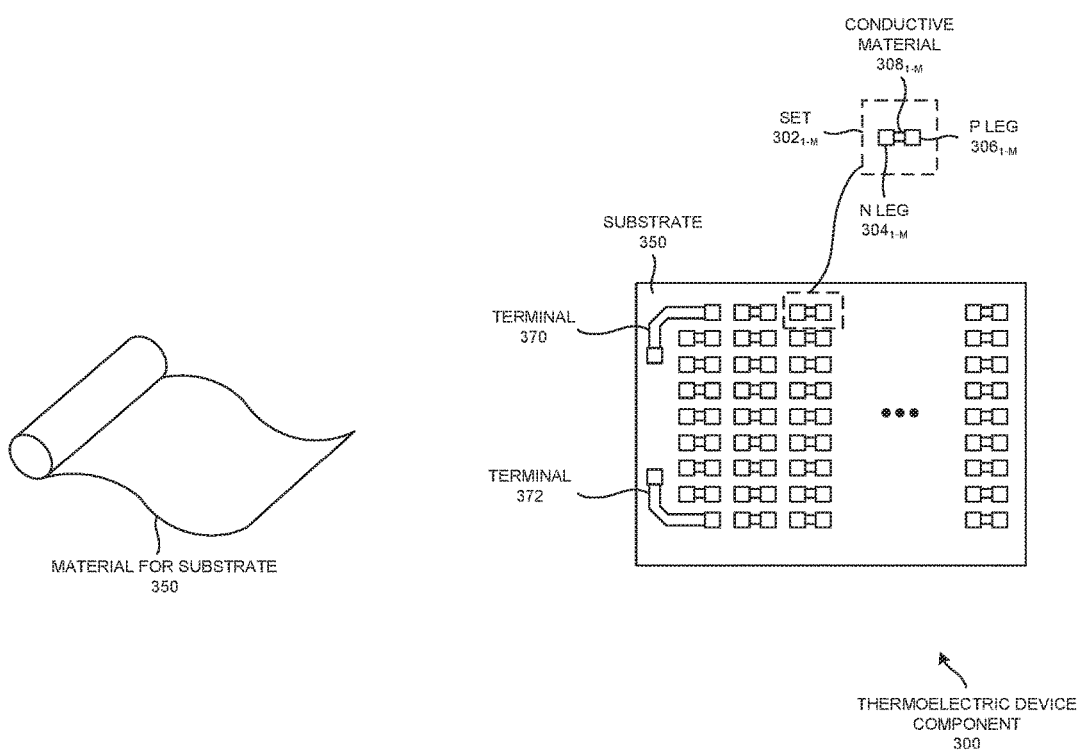
FIG. 3 is a top schematic view of a thermoelectric device component, according to one or more embodiments.

FIG. 3 shows a top view of a thermoelectric device component 300, according to one or more embodiments. Here, in one or more embodiments, a number of sets of N and P legs (e.g., sets $302_{1-M}$ including N legs $304_{1-M}$ and P legs $306_{1-M}$ therein) may be deposited on a substrate 350 (e.g., plastic, Cu clad laminate sheet) using a roll-to-roll process discussed above. FIG. 3 also shows a conductive material $308_{1-M}$ contacting both a set $302_{1-M}$ and substrate 350, according to one or more embodiments; an N leg $304_{1-M}$ and a P leg $306_{1-M}$ form a set $302_{1-M}$, in which N leg $304_{1-M}$ and P leg $306_{1-M}$ electrically contact each other through conductive material $308_{1-M}$. Terminals 370 and 372 may be electrically conductive leads to measure the potential difference generated by a thermoelectric device including thermoelectric device component 300.

Exemplary thermoelectric devices discussed herein may find utility in solar and solar thermal applications. As discussed above, traditional thermoelectric devices may have a size limitation and may not scale to a larger area. For example, a typical solar panel may have an area in the square meter ($m^2$) range and the traditional thermoelectric device may have an area in the square inch range. A thermoelectric device in accordance with the exemplary embodiments may be of varying sizes and/or dimensions ranging from a few $mm^2$ to a few $m^2$.

Additionally, exemplary thermoelectric devices may find use in low temperature applications such as harvesting body heat in a wearable device, automotive devices/components and Internet of Things (IoT). Entities (e.g., companies, start-ups, individuals, conglomerates) may possess expertise to design and/or develop devices that require thermoelectric modules, but may not possess expertise in the fabrication and packaging of said thermoelectric modules. Alternately, even though the entities may possess the requisite expertise in the fabrication and packaging of the thermoelectric modules, the entities may not possess a comparative advantage with respect to the aforementioned processes.

In one scenario, an entity may create or possess a design pattern for a thermoelectric device. Said design pattern may be communicated to another entity associated with a thermoelectric platform to be tangibly realized as a thermoelectric device. It could also be envisioned that the another entity may provide training with regard to the fabrication processes to the one entity or outsource aspects of the fabrication processes to a third-party. Further, the entire set of processes involving Intellectual Property (IP) generation and manufacturing/fabrication of the thermoelectric device may be handled by a single entity. Last but not the least, the entity may generate the IP involving manufacturing/fabrication of the thermoelectric device and outsource the actual manufacturing/fabrication processes to the another entity.

All possible combinations of entities and third-parties are within the scope of the exemplary embodiments discussed herein.

Figure 4:
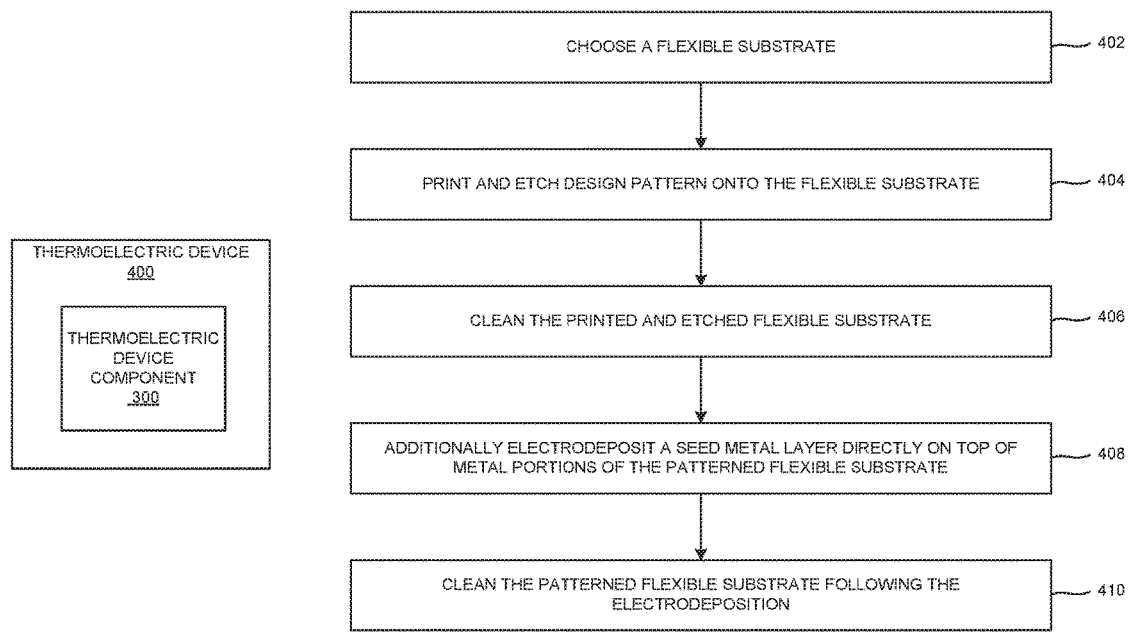
FIG. 4 is a process flow diagram detailing the operations involved in realizing a patterned flexible substrate of a thermoelectric device as per a design pattern, according to one or more embodiments.

FIG. 4 shows the operations involved in realizing a patterned flexible substrate (e.g., patterned flexible substrate 504 shown in FIG. 5) of a thermoelectric device 400 as per a design pattern (e.g., design pattern 502 shown in FIG. 5), according to one or more embodiments. In one or more embodiments, operation 402 may involve choosing a flexible substrate (e.g., substrate 350) onto which, in operation 404, design pattern 502 may be printed (e.g., through inkjet printing, direct write, screen printing) and etched onto the flexible substrate. In one or more embodiments, a dimensional thickness of substrate 350 may be less than or equal to 25 μm.

Figure 5:
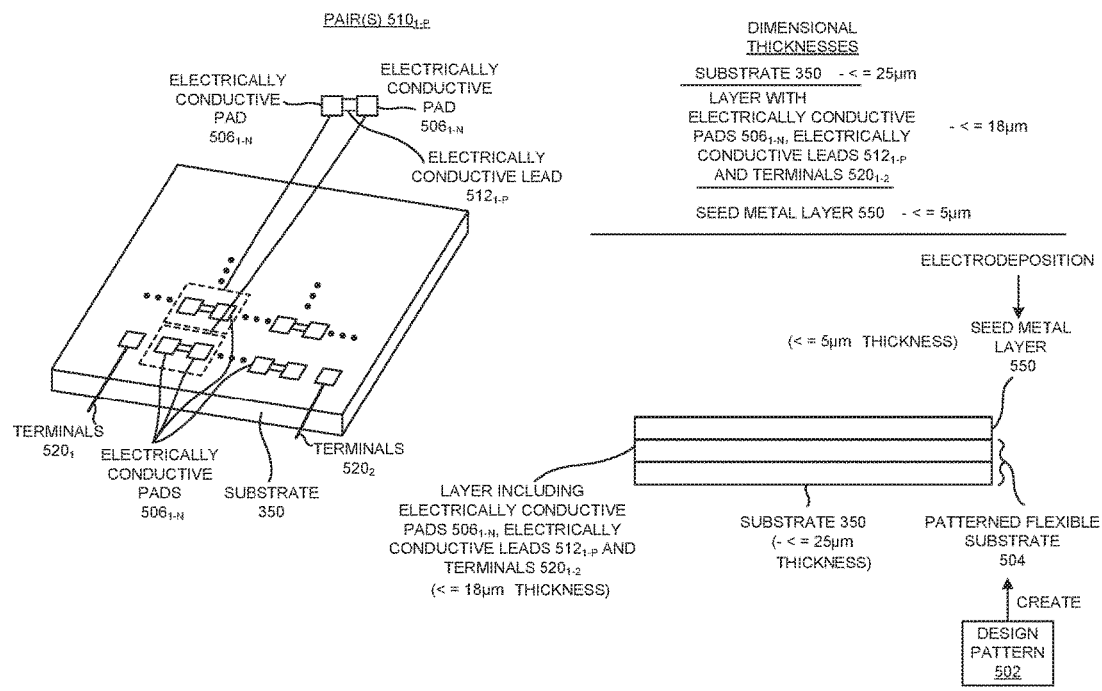
FIG. 5 is a schematic view of the patterned flexible substrate of FIG. 4, according to one or more embodiments.

Etching, as defined above, may refer to the process of removing (e.g., chemically) unwanted metal (say, Cu) from the patterned flexible substrate. In one example embodiment, a mask or a resist may be placed on portions of the patterned flexible substrate corresponding to portions of the metal that are to remain after the etch. Here, in one or more embodiments, the portions of the metal that remain on the patterned flexible substrate may be electrically conductive pads, electrically conductive leads and terminals formed on a surface of the patterned flexible substrate. FIG. 5 shows a patterned flexible substrate 504 including a number of electrically conductive pads $506_{1-N}$ formed thereon. Each electrically conductive pad $506_{1-N}$ may be a flat area of the metal that enables an electrical connection.

Also, FIG. 5 shows a majority set of the electrically conductive pads $506_{1-N}$ as including pairs $510_{1-P}$ of electrically conductive pads $506_{1-N}$ in which one electrically conductive pad $506_{1-N}$ may be electrically paired to another electrically conductive pad $506_{1-N}$ through an electrically conductive lead $512_{1-P}$ also formed on patterned flexible substrate 504; terminals $520_{1-2}$ (e.g., analogous to terminals 370 and 372) may also be electrically conductive leads to measure the potential difference generated by the thermoelectric device/module fabricated based on design pattern 502. The aforementioned potential difference may be generated based on heat (or, cold) applied at an end of the thermoelectric device/module.

It should be noted that the configurations of the electrically conductive pads $506_{1-N}$, electrically conductive leads $512_{1-P}$ and terminals $520_{1-2}$ shown in FIG. 5 are merely for example purposes, and that other example configurations are within the scope of the exemplary embodiments discussed herein. It should also be noted that patterned flexible substrate 504 may be formed based on design pattern 502 in accordance with the printing and etching discussed above.

Example etching solutions employed may include but are not limited to ferric chloride and ammonium persulphate. Referring back to FIG. 4, operation 406 may involve cleaning the printed and etched flexible substrate. For example, acetone, hydrogen peroxide or alcohol may be employed therefor. Other forms of cleaning are within the scope of the exemplary embodiments discussed herein. In one or more embodiments, the aforementioned processes discussed in FIG. 4 may result in a dimensional thickness of electrically conductive pads $506_{1-N}$, electrically conductive leads $512_{1-P}$ and terminals $520_{1-2}$ being less than or equal to 18 μm.

The metal (e.g., Cu) finishes on the surface of patterned flexible substrate 504 may oxidize over time if left unprotected. As a result, in one or embodiments, operation 408 may involve additionally electrodepositing a seed metal layer 550 including Chromium (Cr), Nickel (Ni) and/or Gold (Au) directly on top of the metal portions (e.g., electrically conductive pads $506_{1-N}$, electrically conductive leads $512_{1-P}$, terminals $520_{1-2}$) of patterned flexible substrate 504 following the printing, etching and cleaning. In one or more embodiments, a dimensional thickness of seed metal layer 550 may be less than or equal to 5 μm.

In one example embodiment, surface finishing may be employed to electrodeposit seed metal layer 550; the aforementioned surface finishing may involve Electroless Nickel Immersion Gold (ENIG) finishing. Here, a coating of two layers of metal may be provided over the metal (e.g., Cu) portions of patterned flexible substrate 504 by way of Au being plated over Ni. Ni may be the barrier layer between Cu and Au. Au may protect Ni from oxidization and may provide for low contact resistance. Other forms of surface finishing/electrodeposition may be within the scope of the exemplary embodiments discussed herein. It should be noted that seed metal layer 550 may facilitate contact of sputter deposited N-type thermoelectric legs (to be discussed below) and P-type thermoelectric legs (to be discussed below) thereto.

Figure 6:
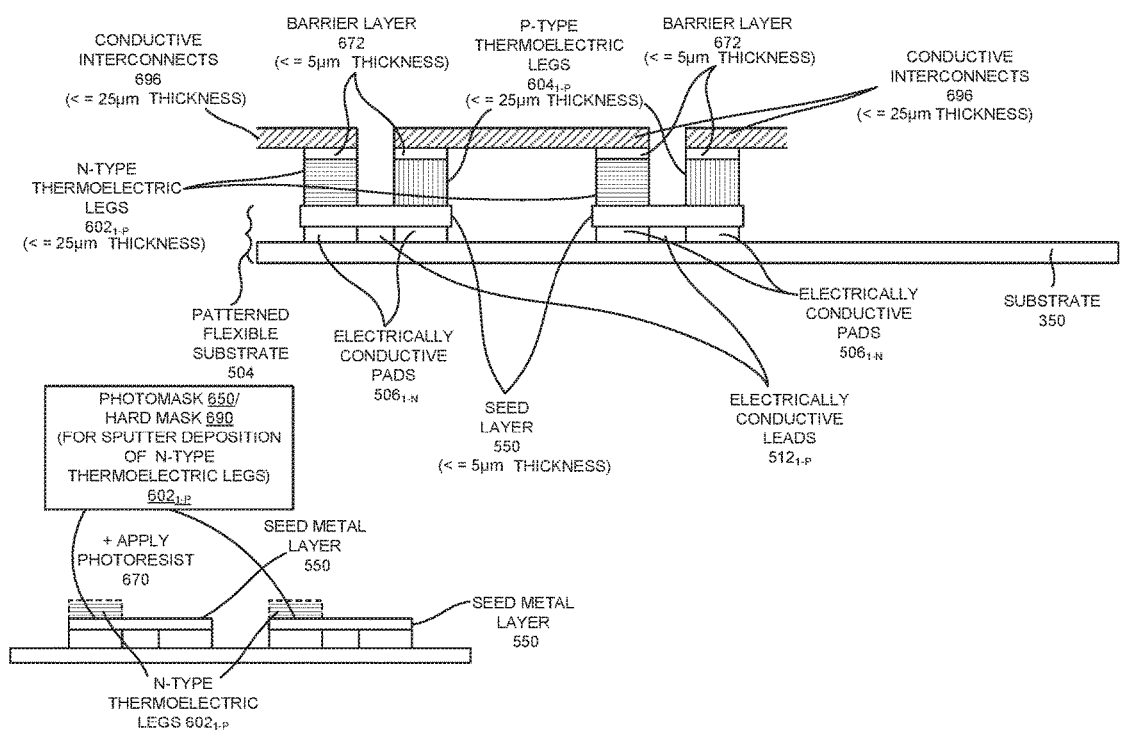
FIG. 6 is a schematic view of the patterned flexible substrate of FIG. 4 with N-type thermoelectric legs, P-type thermoelectric legs, a barrier layer and conductive interconnects, according to one or more embodiments.

In one or more embodiments, operation 410 may then involve cleaning patterned flexible substrate 504 following the electrodeposition. FIG. 6 shows an N-type thermoelectric leg $602_{1-P}$ and a P-type thermoelectric leg $604_{1-P}$ formed on each pair $510_{1-P}$ of electrically conductive pads $506_{1-N}$, according to one or more embodiments. In one or more embodiments, the aforementioned N-type thermoelectric legs $602_{1-P}$ and P-type thermoelectric legs $604_{1-P}$ may be formed on the surface finished patterned flexible substrate 504 (note: in FIG. 6, seed layer 550 is shown as surface finishing over electrically conductive pads $506_{1-N}$/leads $512_{1-P}$; terminals $520_{1-2}$ have been omitted for the sake of clarity) of FIG. 5 through sputter deposition.

Figure 7:
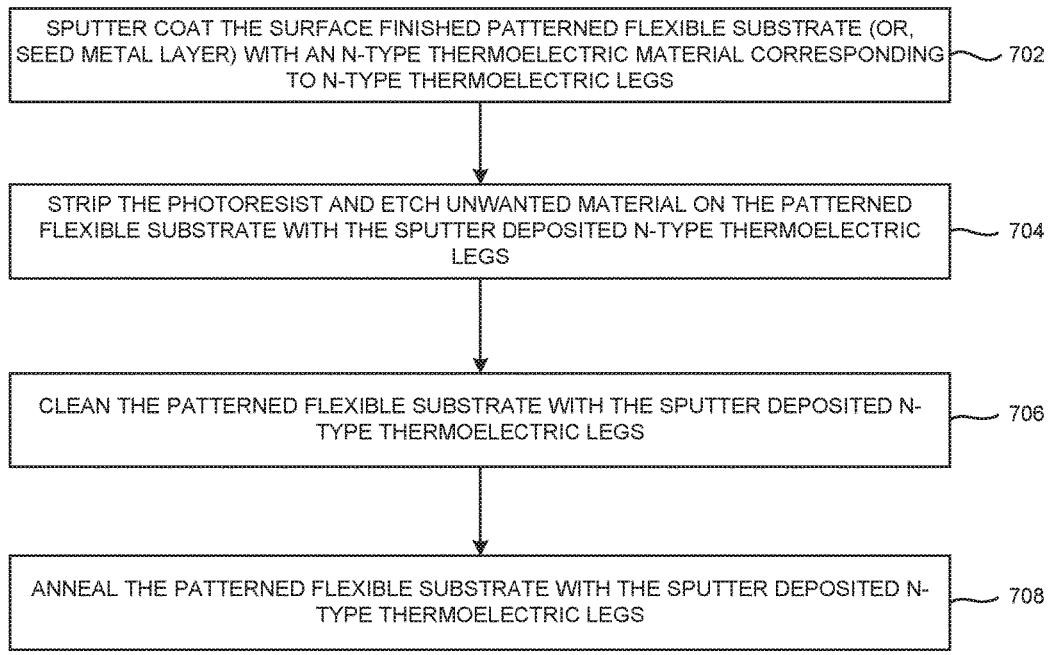
FIG. 7 is a process flow diagram detailing the operations involved in sputter deposition of the N-type thermoelectric legs of FIG. 6 on the patterned flexible substrate (or, a seed metal layer) of FIG. 5, according to one or more embodiments.

FIG. 7 details the operations involved in sputter deposition of N-type thermoelectric legs $602_{1-P}$ on the surface finished patterned flexible substrate 504 (or, seed metal layer 550) of FIG. 5, according to one or more embodiments. In one or more embodiments, the aforementioned process may involve a photomask 650 (shown in FIG. 6) on which patterns corresponding/complementary to the N-type thermoelectric legs $602_{1-P}$ may be generated. In one or more embodiments, a photoresist 670 (shown in FIG. 6) may be applied on the surface finished patterned flexible substrate 504, and photomask 650 placed thereon. In one or more embodiments, operation 702 may involve sputter coating (e.g., through magnetron sputtering) of the surface finished patterned flexible substrate 504 (or, seed metal layer 550) with an N-type thermoelectric material corresponding to N-type thermoelectric legs $602_{1-P}$, aided by the use of photomask 650. The photoresist 670/photomask 650 functions are well understood to one skilled in the art; detailed discussion associated therewith has been skipped for the sake of convenience and brevity.

In one or more embodiments, operation 704 may involve stripping (e.g., using solvents such as dimethyl sulfoxide or alkaline solutions) of photoresist 670 and etching of unwanted material on patterned flexible substrate 504 with sputter deposited N-type thermoelectric legs $602_{1-P}$. In one or more embodiments, operation 706 may involve cleaning the patterned flexible substrate 504 with the sputter deposited N-type thermoelectric legs $602_{1-P}$; the cleaning process may be similar to the discussion with regard to FIG. 4.

In one or more embodiments, operation 708 may then involve annealing the patterned flexible substrate 504 with the sputter deposited N-type thermoelectric legs $602_{1-P}$; the annealing process may be conducted (e.g., in air or vacuum) at 175° C. for 4 hours. In one or more embodiments, the annealing process may remove internal stresses and may contribute stability of the sputter deposited N-type thermoelectric legs $602_{1-P}$. In one or more embodiments, a dimensional thickness of the sputter deposited N-type thermoelectric legs $602_{1-P}$ may be less than or equal to 25 μm.

It should be noted that P-type thermoelectric legs $604_{1-P}$ may also be sputter deposited on the surface finished pattern flexible substrate 504. The operations associated therewith are analogous to those related to the sputter deposition of N-type thermoelectric legs $602_{1-P}$. Obviously, photomask 650 may have patterns corresponding/complementary to the P-type thermoelectric legs $604_{1-P}$ generated thereon. Detailed discussion associated with the sputter deposition of P-type thermoelectric legs $604_{1-P}$ has been skipped for the sake of convenience; it should be noted that a dimensional thickness of the sputter deposited P-type thermoelectric legs $604_{1-P}$ may also be less than or equal to 25 μm.

It should be noted that the sputter deposition of P-type thermoelectric legs $604_{1-P}$ on the surface finished patterned flexible substrate 504 may be performed after the sputter deposition of N-type thermoelectric legs $602_{1-P}$ thereon or vice versa. Also, it should be noted that various feasible forms of sputter deposition are within the scope of the exemplary embodiments discussed herein. In one or more embodiments, the sputter deposited P-type thermoelectric legs $604_{1\text{-}P}$ and/or N-type thermoelectric legs $602_{1\text{-}P}$ may include a material chosen from one of: Bismuth Telluride ($Bi_2Te_3$), Bismuth Selenide ($Bi_2Se_3$), Antimony Telluride ($Sb_2Te_3$), Lead Telluride (PbTe), Silicides, Skutterudites and Oxides.

Figure 8:
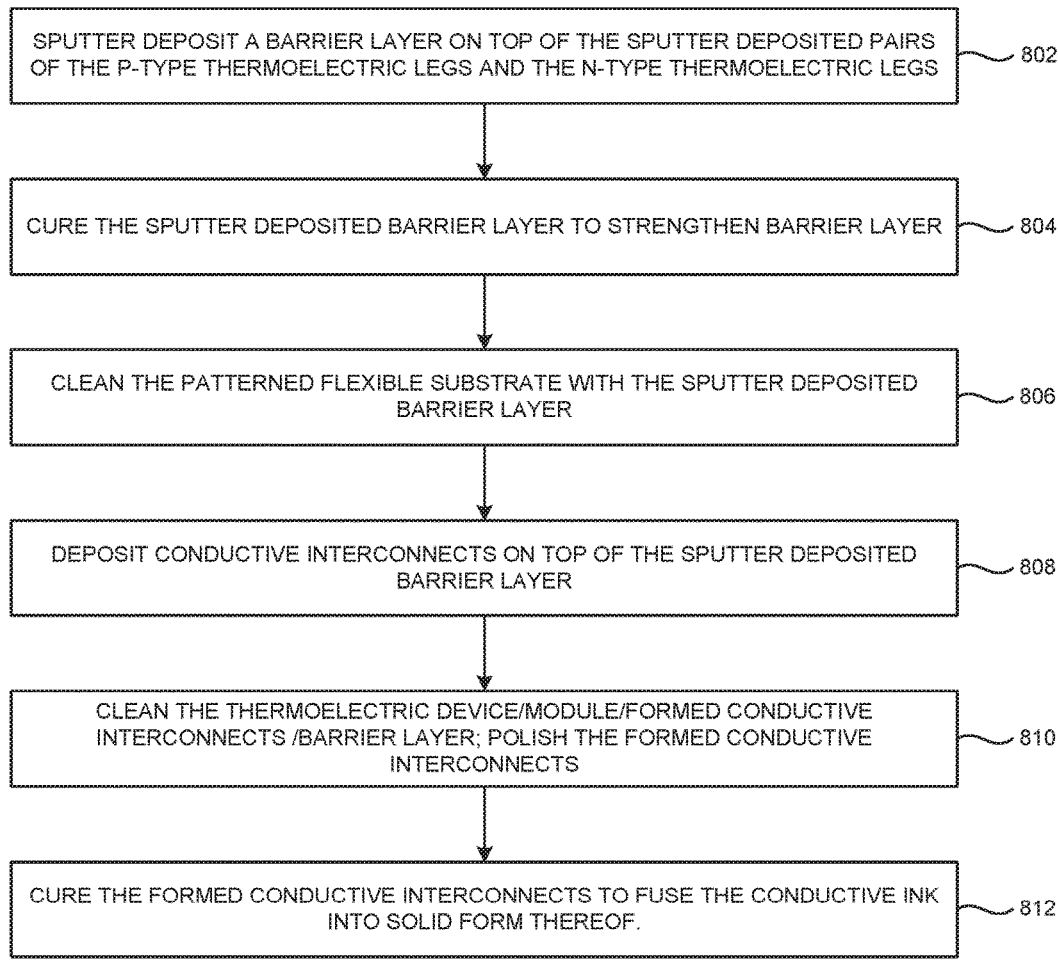
FIG. 8 is a process flow diagram detailing the operations involved in deposition of the barrier layer of FIG. 6 on top of the sputter deposited pairs of P-type thermoelectric legs and the N-type thermoelectric legs of FIG. 6 and forming the conductive interconnects of FIG. 6 on top of the barrier layer, according to one or more embodiments.

FIG. 8 details operations involved in deposition of a barrier layer 672 (refer to FIG. 6) on top of the sputter deposited pairs of P-type thermoelectric legs $604_{1\text{-}P}$ and N-type thermoelectric legs $602_{1\text{-}P}$ and forming conductive interconnects 696 on top of barrier layer 672, according to one or more embodiments.

In one or more embodiments, operation 802 may involve sputter depositing barrier layer 672 (e.g., film) on top of the sputter deposited pairs of the P-type thermoelectric legs $604_{1\text{-}P}$ and the N-type thermoelectric leg $602_{1\text{-}P}$ discussed above. In one or more embodiments, barrier layer 672 may be electrically conductive and may have a higher melting temperature than the thermoelectric material forming the P-type thermoelectric legs $604_{1\text{-}P}$ and the N-type thermoelectric legs $602_{1\text{-}P}$. In one or more embodiments, barrier layer 672 may prevent corruption (e.g., through diffusion, sublimation) of one layer (e.g., the thermoelectric layer including the P-type thermoelectric legs $604_{1\text{-}P}$ and the N-type thermoelectric legs $602_{1\text{-}P}$) by another layer. An example material employed as barrier layer 672 may include but is not limited to Cr, Ni or Au. Further, in one or more embodiments, barrier layer 672 may further aid metallization contact therewith (e.g., with conductive interconnects 696).

In one or more embodiments, a dimensional thickness of barrier layer 672 may be less than or equal to 5 μm. It is obvious that another photomask (not shown) analogous to photomask 650 may be employed to aid the patterned sputter deposition of barrier layer 672; details thereof have been skipped for the sake of convenience and clarity. In one or more embodiments, operation 804 may involve may involve curing barrier layer 672 at 175° C. for 4 hours to strengthen barrier layer 672. In one or more embodiments, operation 806 may then involve cleaning patterned flexible substrate 504 with barrier layer 672.

In one or more embodiments, operation 808 may involve depositing conductive interconnects 696 on top of barrier layer 672. In one example embodiment, the aforementioned deposition may be accomplished by screen printing silver (Ag) ink or other conductive forms of ink on barrier layer 672. Other forms of conductive interconnects 696 based on conductive paste(s) are within the scope of the exemplary embodiments discussed herein. As shown in FIG. 8, a hard mask 850 may be employed to assist the selective application of conductive interconnects 696 based on screen printing of Ag ink. In one example embodiment, hard mask 850 may be a stencil.

In one or more embodiments, the screen printing of Ag ink may contribute to the continued flexibility of the thermoelectric device/module and low contact resistance. In one or more embodiments, operation 810 may involve cleaning (e.g., using one or more of the processes discussed above) the thermoelectric device/module/formed conductive interconnects 696/barrier layer 672 and polishing conductive interconnects 696. In one example embodiment, the polishing may be followed by another cleaning process. In one or more embodiments, operation 812 may then involve curing conductive interconnects 696 at 175° C. for 4 hours to fuse the conductive ink into solid form thereof. In one or more embodiments, conductive interconnects 696 may have a dimensional thickness less than or equal to 25 μm.

Figure 9:
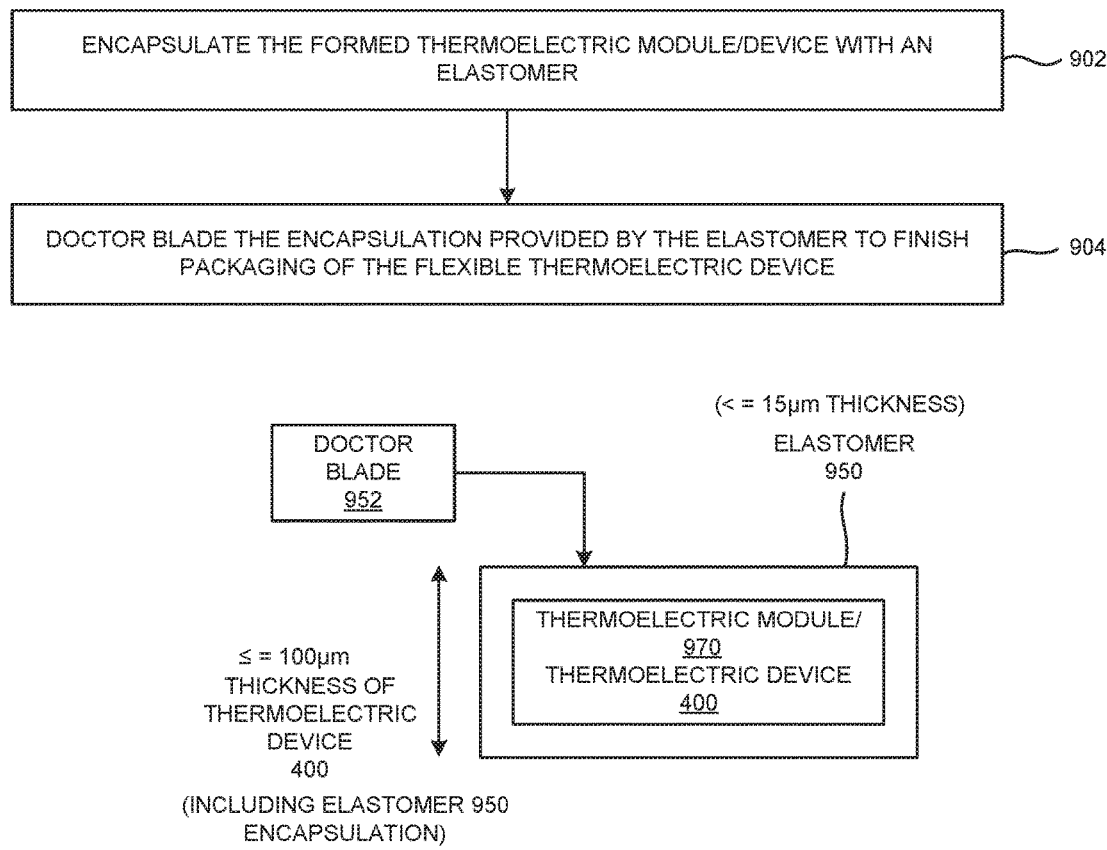
FIG. 9 is a process flow diagram detailing the operations involved in encapsulating the thermoelectric device of FIG. 4 and FIG. 6, according to one or more embodiments.

FIG. 9 details the operations involved in encapsulating the thermoelectric device (e.g., thermoelectric module 970)/module discussed above, according to one or more embodiments. In one or more embodiments, operation 902 may involve encapsulating the formed thermoelectric module (e.g., thermoelectric module 970)/device (with barrier layer 672 and conductive interconnects 696) with an elastomer 950 to render flexibility thereto. In one or more embodiments, as shown in FIG. 9, the encapsulation provided by elastomer 950 may have a dimensional thickness of less than or equal to 15 μm. In one or more embodiments, operation 904 may involve doctor blading (e.g., using doctor blade 952) the encapsulation provided by elastomer 950 to finish packaging of the flexible thermoelectric device/module discussed above.

In one or more embodiments, the doctor blading may involve controlling precision of a thickness of the encapsulation provided by elastomer 950 through doctor blade 952. In one example embodiment, elastomer 950 may be silicone. Here, said silicone may be loaded with nano-size aluminum oxide ($Al_2O_3$) powder to enhance thermal conductivity thereof to aid heat transfer across the thermoelectric module.

Figure 10:
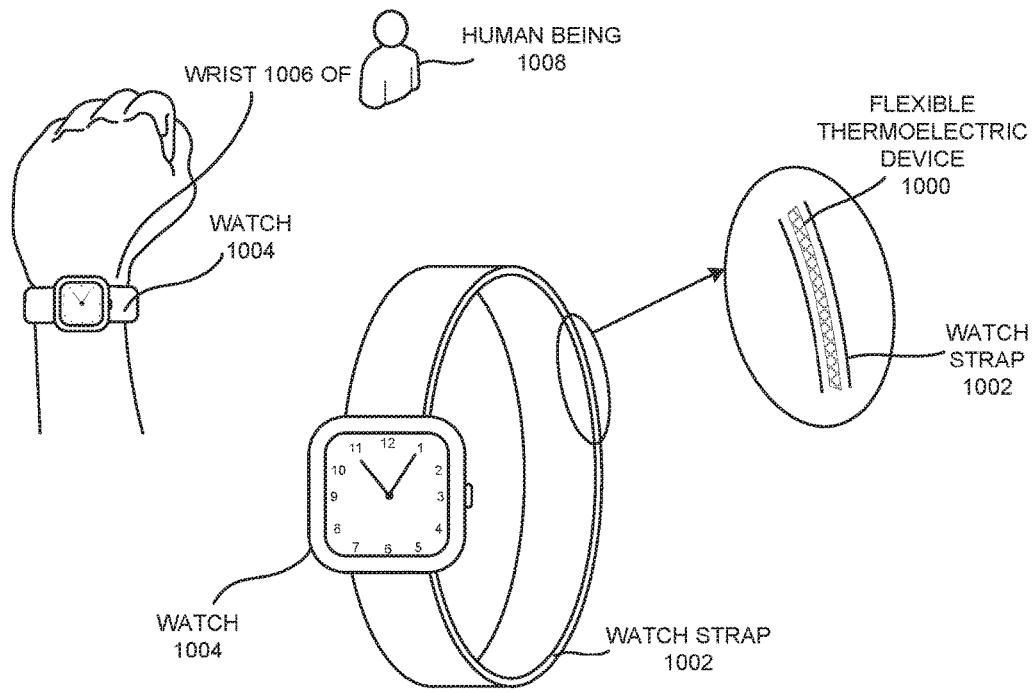
FIG. 10 is a schematic view of a flexible thermoelectric device embedded within a watch strap of a watch completely wrappable around a wrist of a human being.
Figure 10:
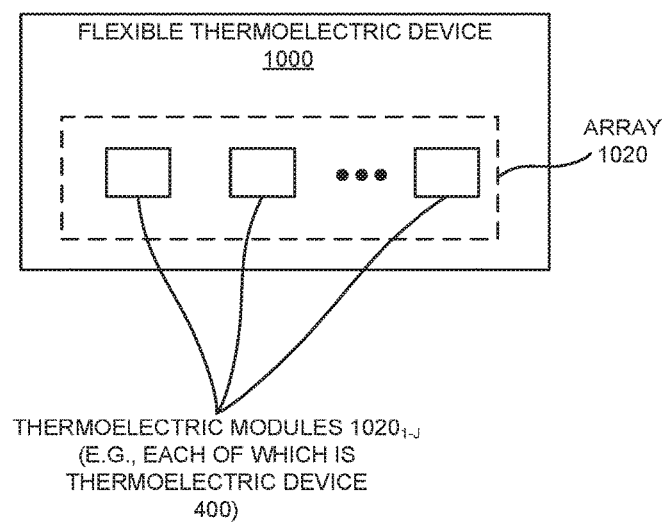
Figure 11:
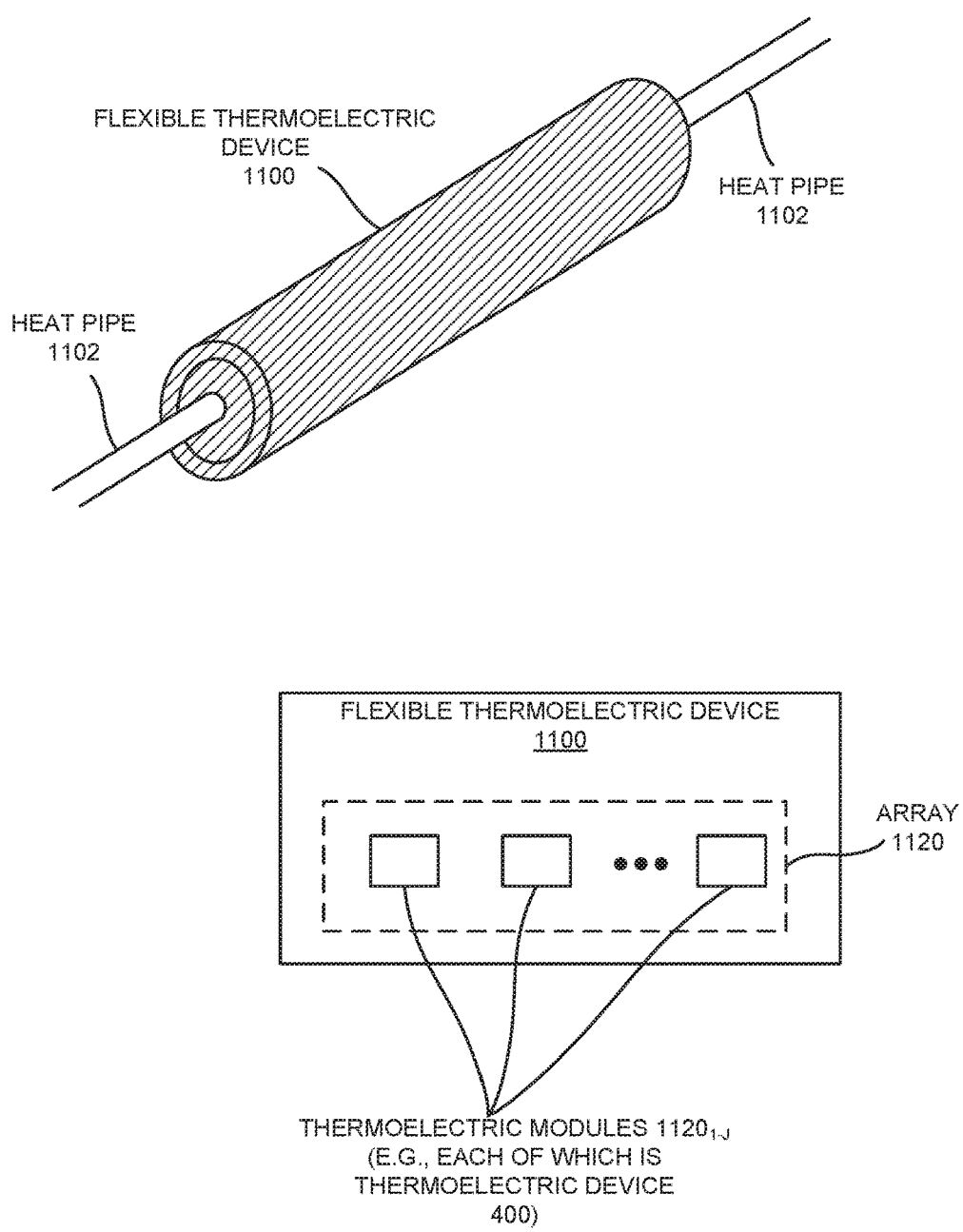
FIG. 11 is a schematic view of a flexible thermoelectric device wrapped around a heat pipe.

In one or more embodiments, as seen above, all operations involved in fabricating the thermoelectric device/module (e.g., thermoelectric device 400) render said thermoelectric device/module flexible. FIG. 10 shows a flexible thermoelectric device 1000 discussed herein embedded within a watch strap 1002 of a watch 1004 completely wrappable around a wrist 1006 of a human being 1008; flexible thermoelectric device 1000 may include an array 1020 of thermoelectric modules $1020_{1\text{-}J}$ (e.g., each of which is thermoelectric device 400) discussed herein. In one example embodiment, flexible thermoelectric device 1000 may serve to augment or substitute power derivation from a battery of watch 1004. FIG. 11 shows a flexible thermoelectric device 1100 discussed herein wrapped around a heat pipe 1102; again, flexible thermoelectric device 1100 may include an array 1120 of thermoelectric modules $1120_{1\text{-}J}$ (e.g., each of which is thermoelectric device 400) discussed herein. In one example embodiment, flexible thermoelectric device 1100 may be employed to derive thermoelectric power (e.g., through array 1120) from waste heat from heat pipe 1102.

It should be noted that although photomask 650 is discussed above with regard to deposition of N-type thermoelectric legs $602_{1\text{-}P}$ and a P-type thermoelectric legs $604_{1\text{-}P}$, the aforementioned deposition may, in one or more other embodiments, involve a hard mask 690, as shown in FIG. 6. Further, it should be noted that flexible thermoelectric device 400/1000/1100 may be fabricated/manufactured such that the aforementioned device is completely wrappable and bendable around a system element (e.g., watch 1004, heat pipe 1102) that requires said flexible thermoelectric device 400/1000/1100 to perform a thermoelectric power generation function using the system element.

The abovementioned flexibility of thermoelectric device 400/1000/1100 may be enabled through proper selection of flexible substrates (e.g., substrate 350) and manufacturing techniques/processes that aid therein, as discussed above. Further, flexible thermoelectric device 1000/1100 may be bendable 360° such that the entire device may completely wrap around the system element discussed above. Still further, in one or more embodiments, an entire dimensional thickness of the flexible thermoelectric module (e.g., flexible thermoelectric device 400) in a packaged form may be less than or equal to 100 μm, as shown in FIG. 9.

Last but not the least, as the dimensions involved herein are restricted to less than or equal to 100 μm, the flexible thermoelectric device/module discussed above may be regarded as being thin-film based (e.g., including processes involved in fabrication thereof).

Figure 12:
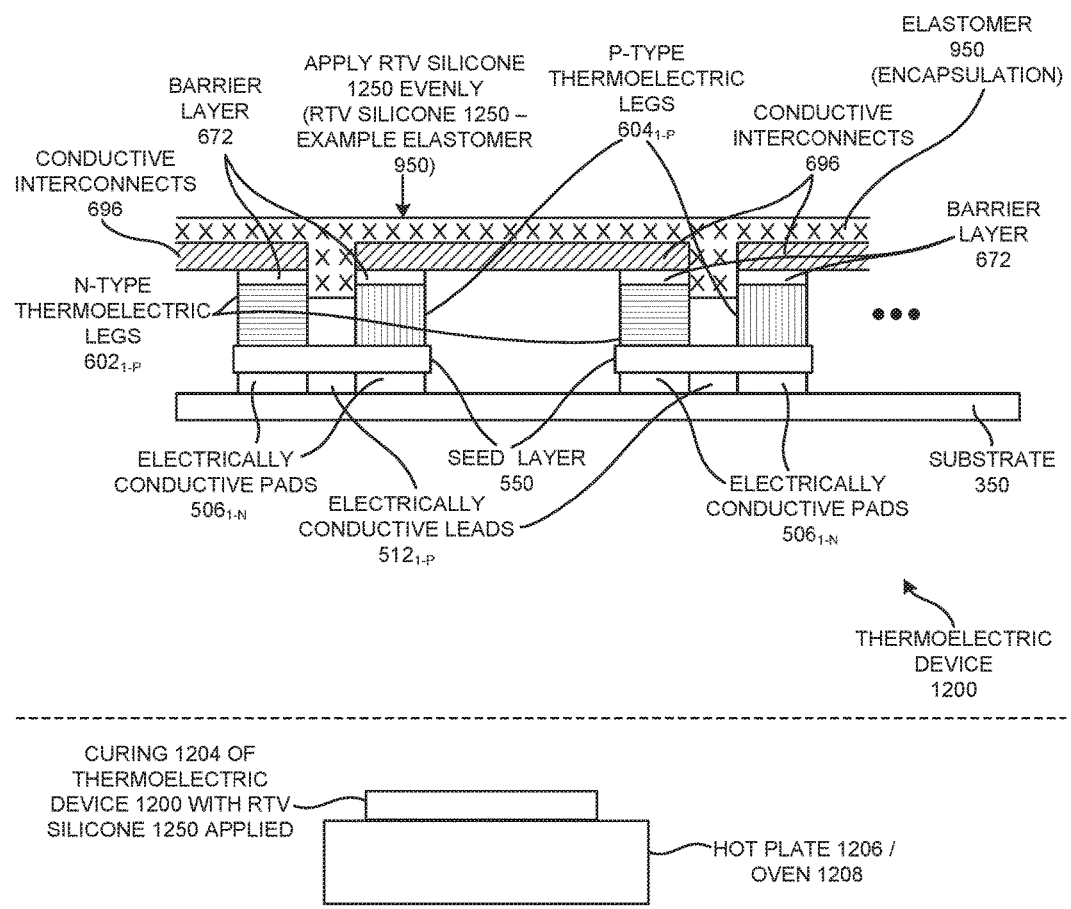
FIG. 12 is a schematic view of a thermoelectric device with elastomer encapsulation, according to one or more embodiments.

FIG. 12 shows a thermoelectric device 1200 (e.g., thermoelectric module 970, also refer to the thermoelectric device of FIG. 6) discussed herein with elastomer encapsulation, according to one or more embodiments. In one or more embodiments, elastomer 950 may be provided on top of conductive interconnects 696; in certain embodiments, the encapsulation provided through elastomer 950 may extend into physical spaces between adjacent N-type thermoelectric legs $602_{1-P}$ and P-type thermoelectric legs $604_{1-P}$ in a direction perpendicular to a plane of substrate 350.

FIG. 12 also shows Room Temperature Vulcanizing (RTV) silicone 1250 (example elastomer 950) applied evenly across a surface of the thermoelectric device of FIG. 6, according to one or more embodiments. In one or more embodiments, as conductive interconnects 696 may be discontinuous and/or the adjacent N-type thermoelectric legs $602_{1-P}$ and P-type thermoelectric legs $604_{1-P}$ may have physical spaces therebetween, one or more hard mask(s) (e.g., one or more stencil(s); similar to hard mask 690/850) with patterns corresponding to the thermoelectric device of FIG. 6 and the desired configuration of the encapsulation may be employed to apply said RTV silicone 1250 evenly across the surface of the thermoelectric device.

In one or more embodiments, following the application of RTV silicone 1250, thermoelectric device 1200/RTV silicone 1250 may be cured (e.g., curing 1204 on a hot plate 1206 or an oven 1208) at 150° C. to strengthen the formed layer. It should be noted that, in one or more other embodiments, RTV silicone 1250 may be mixed with a thinner (not shown; e.g., silicone fluid; other examples are within the scope of the exemplary embodiments discussed herein) to enable the resulting mixture to provide for a less than 10 μm thickness of the formed encapsulation layer (in general, as discussed above, the encapsulation layer may be less than or equal to 15 μm in thickness). In certain other embodiments, RTV silicone 1250 may be mixed with finely dispersed Alumina ($Al_2O_3$) particles (not shown) to improve thermal conductivity thereof. It should be noted that the encapsulation may not solely be based on the doctor blading discussed above. Other methods to accomplish the encapsulation such as spin coating are within the scope of the exemplary embodiments discussed herein.

It is obvious that it may be advantageous to use filler material (e.g., $Al_2O_3$) of a higher thermal conductivity and/or a higher volume fraction to drastically improve thermal conductivity of the resultant mixture of RTV silicone and said filler material without sacrificing the desired final thickness (e.g., the thinner the better) of the encapsulation. Also, it is obvious that elastomer 950 may not solely be limited to RTV silicone 1250. Varieties of market ready high thermally conductive materials (e.g., filler material) and elastomers (or rubber) may be available for use in thermoelectric device 1200 and, therefore, are within the scope of the exemplary embodiments discussed herein.

Figure 13:
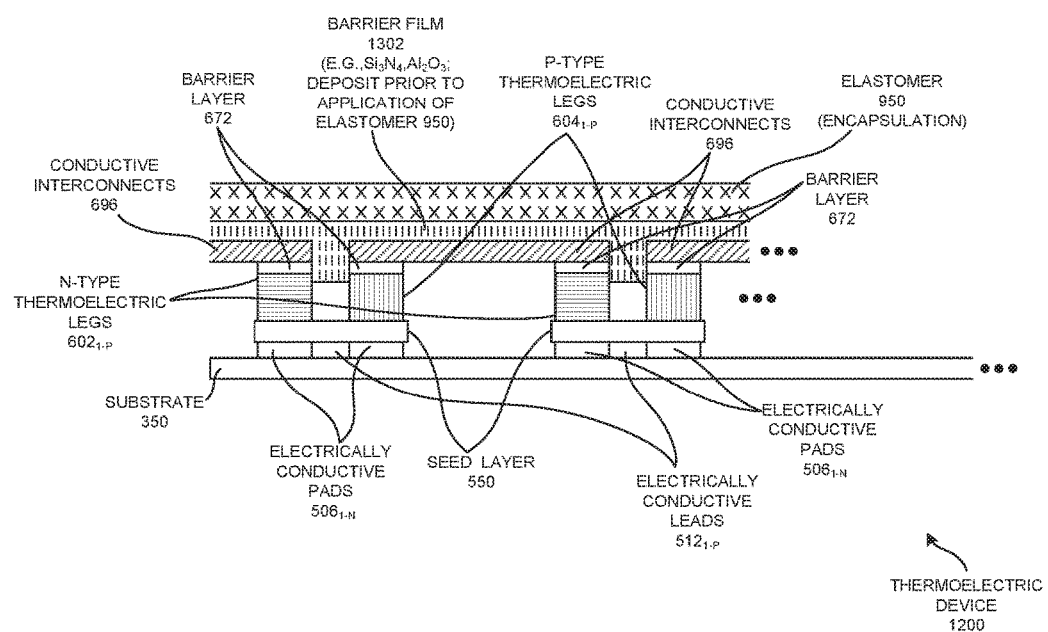
FIG. 13 is a schematic view of deposition of a barrier film prior to application of an elastomer to encapsulate the thermoelectric device of FIG. 12, according to one or more embodiments.

FIG. 13 shows deposition (e.g., through sputtering) of a barrier film 1302 (e.g., of Silicon Nitride ($Si_3N_4$), of Alumina ($Al_2O_3$)) prior to application of elastomer 950 (e.g., RTV silicone, an elastomer with thinner, an elastomer with filler material) to encapsulate thermoelectric device 1200, according to one or more embodiments. In one or more embodiments, barrier film 1302 may be deposited (e.g., on top of conductive interconnects 696) to reduce moisture/water vapor/oxygen pervasion into layers of thermoelectric device 1200. It is obvious that moisture barrier thin-films (e.g., barrier film 1302) other than those including $Si_3N_4$ and/or $Al_2O_3$ may be employed in thermoelectric device 1200 prior to encapsulation thereof.

In one or more embodiments, a photomask or a hard mask (e.g., analogous to photo mask 650/hard mask 850) with patterns corresponding to barrier film 1302/elastomer 950 may be employed in the abovementioned deposition of barrier film 1302. In one example implementation, a 1-2 μm $Si_3N_4$ film may be sputter deposited to provide hermetic sealing to the thermoelectric layers of thermoelectric device 1200 for passivation purposes; then, RTV silicone rubber material (example elastomer 950) may be placed evenly thereon (e.g., based on doctor blading) to encapsulate thermoelectric device 1200; for example, the RTV silicone rubber material may be provided/placed around the $Si_3N_4$ film. The encapsulated thermoelectric device 1200/example elastomer 950 may then be cured at 150° C. for a couple of hours to cross-link polymers therein and to provide sealing.

It should be noted that the exemplary embodiments discussed herein provide for encapsulating the thin-film flexible thermoelectric device 1200 into a state of permanent sealing; only output pads may be exposed. As discussed above, the encapsulation may be less than or equal to 15 μm in thickness (in one embodiment, the encapsulation may be less than 10 μm in thickness). The abovementioned process of encapsulation, in conjunction with other processes involved in fabrication/manufacturing of thermoelectric device 400/thermoelectric module 970/thermoelectric device 1200, may enable said device to stretch or bend based on the flexibility of the final product discussed above.

Figure 14:
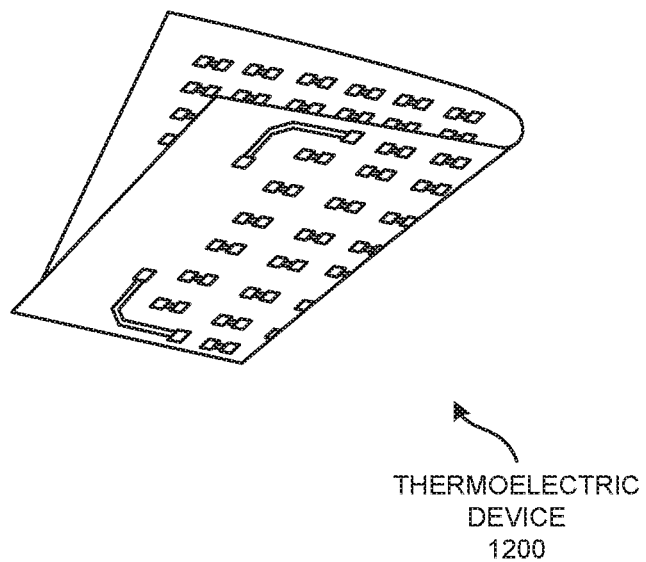
FIG. 14 is a schematic view of flexibility and bendability of an example thermoelectric device in accordance with the embodiment of FIG. 12.

FIG. 14 shows flexibility and bendability of an example thermoelectric device 1200 manufactured in accordance with the processes discussed herein. The aforementioned flexibility and bendability may facilitate use of the example thermoelectric device 1200 in a variety of applications, some of which are discussed with reference to FIGS. 10-11.

In typical bulk thermoelectric modules, top and bottom metal traces (e.g., metal traces analogous to conductive interconnects 696 and seed layer 550) may be separated by thermoelectric legs that are generally more than 1 mm in height/length. Because of this significant length, the top and bottom metal traces may not come in contact with one another during soldering, thereby preventing shunting therebetween. In contrast, exemplary embodiments discussed herein provide for thermoelectric device 400/thermoelectric module 970/thermoelectric device 1200 with small N-type thermoelectric legs $602_{1-P}$ and P-type thermoelectric legs $604_{1-P}$. Therefore, in one or more embodiments, the small thermoelectric leg height/dimension may lead to the top metal trace shunting the bottom metal trace during metal deposition, thereby producing no voltage.

In order to avoid the above shunting, in one or more embodiments, the area of each of the N-type thermoelectric legs $602_{1-P}$ and P-type thermoelectric legs $604_{1-P}$ may be chosen to be larger than the area of corresponding electrically conductive pads $506_{1-N}$. In other words, more area corresponding to N-type thermoelectric legs $602_{1-P}$ and P-type thermoelectric legs $604_{1-P}$ may cover electrically conductive pads $506_{1-N}$ than required to ensure no shunting during deposition of conductive interconnects 696.

Figure 15:
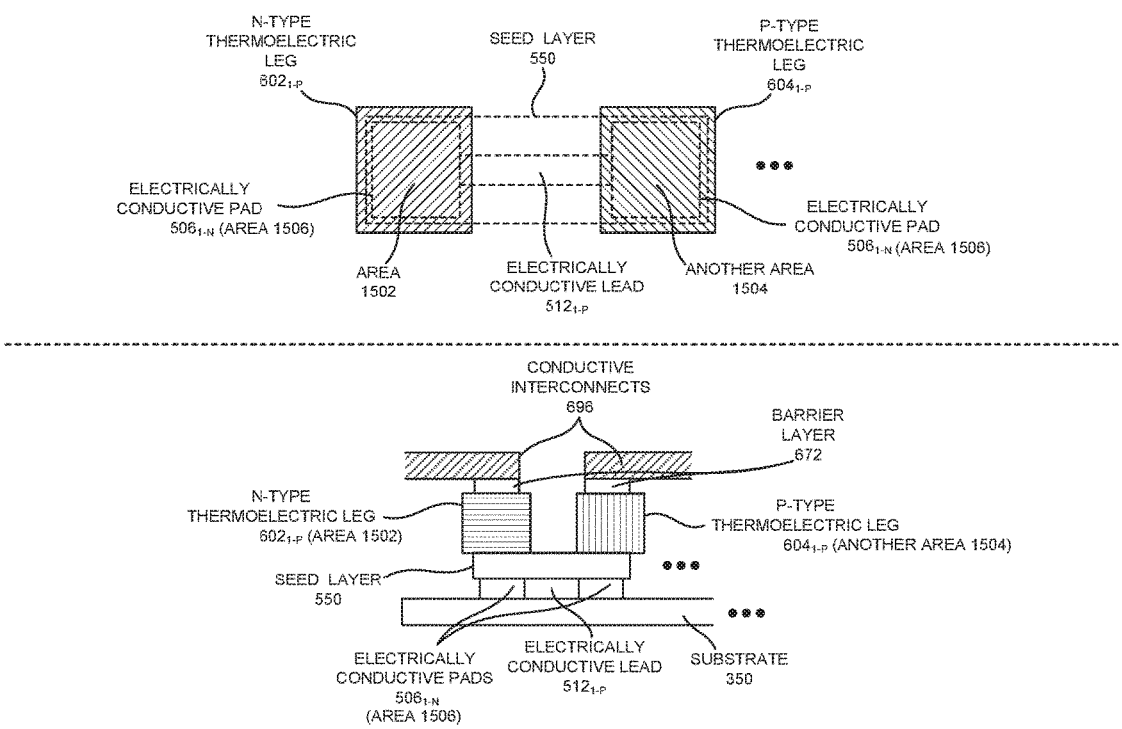
FIG. 15 is a schematic view of an increased/extended area of an N-type thermoelectric leg and another increased/extended area of a P-type thermoelectric leg compared to an area of corresponding electrically conductive pads to ensure no shunting during deposition of conductive interconnects in the thermoelectric devices of FIGS. 6 and 8-14, according to one or more embodiments.

FIG. 15 shows extended (or, increased) area 1502 of an N-type thermoelectric leg $602_{1-P}$ and another extended (or, increased) area 1504 of a P-type thermoelectric leg $604_{1-P}$ compared to area 1506 of corresponding electrically conductive pads $506_{1-N}$ to ensure no shunting during deposition of conductive interconnects 696, according to one or more embodiments. In the top view, the corresponding electrically conductive pads $506_{1-N}$, the corresponding electrically conductive lead $512_{1-P}$ and seed metal layer 550 underneath N-type thermoelectric leg $602_{1-P}$ and P-type thermoelectric leg $604_{1-P}$ are shown in dotted lines to illustrate that area 1502 and another area 1504 of N-type thermoelectric leg $602_{1-P}$ and P-type thermoelectric leg $604_{1-P}$ respectively extend outside (or, are greater than) area 1506 of the corresponding electrically conductive pads $506_{1-N}$. This is also clearly shown in the front view of the specific element of the thermoelectric device (e.g., thermoelectric device 1200) illustrated in FIG. 15. It is obvious that the increased leg area concept extends to all sputter deposited N-type thermoelectric legs $602_{1-P}$ and P-type thermoelectric legs $604_{1-P}$ and corresponding electrically conductive pads $506_{1-N}$ thereof in an exemplary thermoelectric device (e.g., thermoelectric device 1200) discussed herein.

Figure 16:
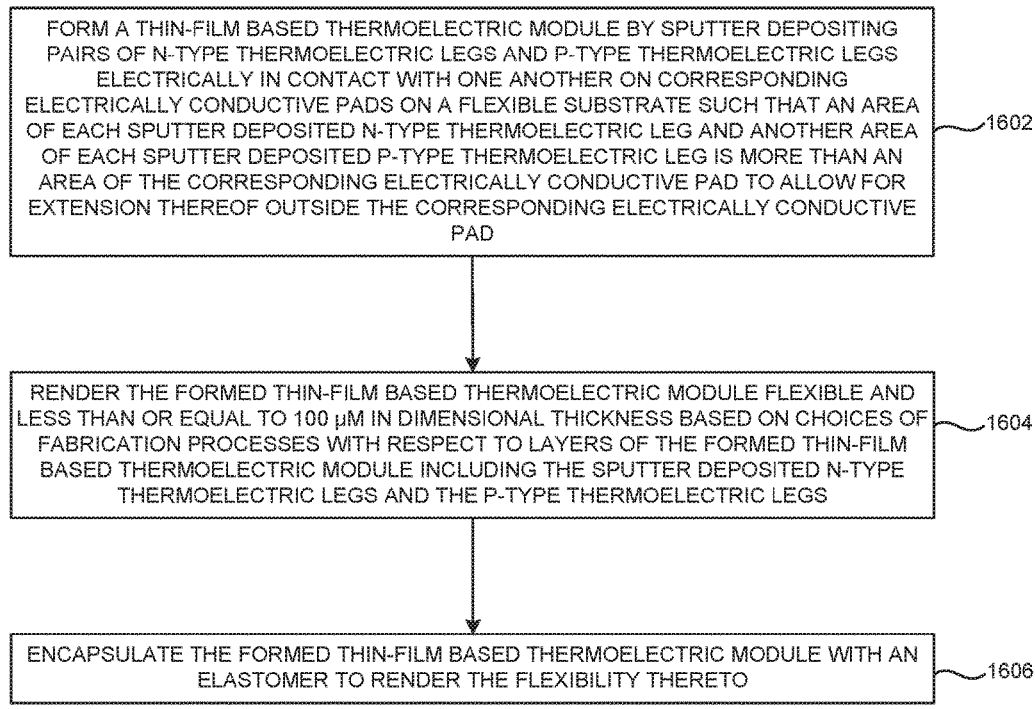
FIG. 16 is a process flow diagram detailing the operations involved in realizing a flexible thin-film based thermoelectric module with sputter deposited N-type and P-type thermoelectric legs having extended areas thereof, according to one or more embodiments.

FIG. 16 shows a process flow diagram detailing the operations involved in realizing a flexible thin-film based thermoelectric module (e.g., thermoelectric device 1200) with a sputter deposited layer of N-type (e.g., N-type thermoelectric legs $602_{1-P}$) and P-type (e.g., P-type thermoelectric legs $604_{1-P}$) thermoelectric legs having extended areas thereof, according to one or more embodiments.

In one or more embodiments, operation 1602 may involve forming the thin-film based thermoelectric module by sputter depositing pairs of N-type thermoelectric legs and P-type thermoelectric legs electrically in contact with one another on corresponding electrically conductive pads (e.g., conductive pads $506_{1-N}$) on a flexible substrate (e.g., substrate 350) such that an area (e.g., including area 1502) of each sputter deposited N-type thermoelectric leg and another area (e.g., including area 1504) of each sputter deposited P-type thermoelectric leg is more than an area (e.g., area 1506) of the corresponding electrically conductive pad to allow for extension thereof outside the corresponding electrically conductive pad. In one or more embodiments, the flexible substrate may be an Al foil, a sheet of paper, teflon, plastic, a single-sided Cu clad laminate sheet, or a double-sided Cu clad laminate sheet, and may have a dimensional thickness less than or equal to 25 µm.

In one or more embodiments, operation 1604 may involve rendering the formed thin-film based thermoelectric module flexible and less than or equal to 100 µm in dimensional thickness based on choices of fabrication processes with respect to layers of the formed thin-film based thermoelectric module including the sputter deposited N-type thermoelectric legs and the P-type thermoelectric legs. In one or more embodiments, operation 1606 may then involve encapsulating the formed thin-film based thermoelectric module with an elastomer (e.g., elastomer 950) to render the flexibility thereto.

In one or more embodiments, the elastomer encapsulation may have a dimensional thickness less than or equal to 15 µm. In one or more embodiments, the flexibility may enable an array (e.g., array 1020/1120) of thin-film based thermoelectric modules, each of which is equivalent to the thin-film based thermoelectric module formed on the flexible substrate with the elastomer encapsulation, to be completely wrappable and bendable around a system element from which the array of the thin-film based thermoelectric modules is configured to derive thermoelectric power.

In one or more embodiments, a layer of the formed thin-film based thermoelectric module including the sputter deposited N-type thermoelectric legs and the P-type thermoelectric legs may have a dimensional thickness less than or equal to 25 µm.

Although the present embodiments have been described with reference to specific example embodiments, it will be evident that various modifications and changes may be made to these embodiments without departing from the broader spirit and scope of the various embodiments. Accordingly, the specification and drawings are to be regarded in an illustrative rather than a restrictive sense.

What is claimed is:

1. A method of a thin-film based thermoelectric module, comprising:
    forming the thin-film based thermoelectric module by sputter depositing pairs of N-type thermoelectric legs and P-type thermoelectric legs electrically in contact with one another on corresponding electrically conductive pads on a flexible substrate such that an area of each sputter deposited N-type thermoelectric leg and another area of each sputter deposited P-type thermoelectric leg is more than an area of the corresponding electrically conductive pad to allow for extension thereof outside the corresponding electrically conductive pad, the flexible substrate being one of: aluminum (Al) foil, a sheet of paper, teflon, plastic, a single-sided copper (Cu) clad laminate sheet, and a double-sided Cu clad laminate sheet, and the flexible substrate having a dimensional thickness less than or equal to 25 µm;
    rendering the formed thin-film based thermoelectric module flexible and less than or equal to 100 µm in dimensional thickness based on choices of fabrication processes with respect to layers of the formed thin-film based thermoelectric module including the sputter deposited N-type thermoelectric legs and the P-type thermoelectric legs; and
    encapsulating the formed thin-film based thermoelectric module with an elastomer to render the flexibility thereto, the elastomer encapsulation having a dimensional thickness less than or equal to 15 µm, the flexibility enabling an array of thin-film based thermoelectric modules, each of which is equivalent to the thin-film based thermoelectric module formed on the flexible substrate with the elastomer encapsulation, to be completely wrappable and bendable around a system element from which the array of the thin-film based thermoelectric modules is configured to derive thermoelectric power, and a layer of the formed thin-film based thermoelectric module including the sputter deposited N-type thermoelectric legs and the P-type thermoelectric legs having a dimensional thickness less than or equal to 25 µm.

2. The method of claim 1, comprising utilizing one of: a photomask and a hard mask with patterns corresponding to one of: the N-type thermoelectric legs and the P-type thermoelectric legs to aid the sputter deposition thereof.

3. The method of claim 1, further comprising printing and etching a design pattern of metal onto the flexible substrate to form the corresponding electrically conductive pads.

4. The method of claim 3, further comprising sputter depositing a barrier metal layer comprising one of: Cr, Ni and Au on top of the sputter deposited pairs of the N-type thermoelectric legs and the P-type thermoelectric legs utilizing one of: another photomask and another hard mask to further aid metallization contact therewith.

5. The method of claim 4, further comprising depositing conductive interconnects on top of the sputter deposited barrier metal layer utilizing a hard mask to assist selective application thereof.

6. The method of claim 5, further comprising depositing the conductive interconnects through screen printing conductive forms of ink on the sputter deposited barrier metal layer.

7. The method of claim 1, comprising:
depositing a moisture barrier thin film on the formed thin-film based thermoelectric module prior to the encapsulation thereof with the elastomer; and
providing the encapsulation through the elastomer around the deposited moisture barrier thin film.

8. A method of a thin-film based thermoelectric module, comprising:
forming the thin-film based thermoelectric module by sputter depositing pairs of N-type thermoelectric legs and P-type thermoelectric legs electrically in contact with one another on corresponding electrically conductive pads on a flexible substrate such that an area of each sputter deposited N-type thermoelectric leg and another area of each sputter deposited P-type thermoelectric leg is more than an area of the corresponding electrically conductive pad to allow for extension thereof outside the corresponding electrically conductive pad, the flexible substrate being one of: Al foil, a sheet of paper, teflon, plastic, a single-sided Cu clad laminate sheet, and a double-sided Cu clad laminate sheet, and the flexible substrate having a dimensional thickness less than or equal to 25 µm;
rendering the formed thin-film based thermoelectric module flexible and less than or equal to 100 µm in dimensional thickness based on choices of fabrication processes with respect to layers of the formed thin-film based thermoelectric module including the sputter deposited N-type thermoelectric legs and the P-type thermoelectric legs, a layer of the formed thin-film based thermoelectric module including the sputter deposited N-type thermoelectric legs and the P-type thermoelectric legs having a dimensional thickness less than or equal to 25 µm;
encapsulating the formed thin-film based thermoelectric module with an elastomer to render the flexibility thereto, the elastomer encapsulation having a dimensional thickness less than or equal to 15 µm; and
wrapping and bending an array of thin-film based thermoelectric modules, each of which is equivalent to the thin-film based thermoelectric module formed on the flexible substrate with the elastomer encapsulation, completely around a system element from which the array of the thin-film based thermoelectric modules is configured to derive thermoelectric power in accordance with the flexibility thereof.

9. The method of claim 8, comprising utilizing one of: a photomask and a hard mask with patterns corresponding to one of: the N-type thermoelectric legs and the P-type thermoelectric legs to aid the sputter deposition thereof.

10. The method of claim 8, further comprising printing and etching a design pattern of metal onto the flexible substrate to form the corresponding electrically conductive pads.

11. The method of claim 10, further comprising sputter depositing a barrier metal layer comprising one of: Cr, Ni and Au on top of the sputter deposited pairs of the N-type thermoelectric legs and the P-type thermoelectric legs utilizing one of: another photomask and another hard mask to further aid metallization contact therewith.

12. The method of claim 11, further comprising depositing conductive interconnects on top of the sputter deposited barrier metal layer utilizing a hard mask to assist selective application thereof.

13. The method of claim 12, further comprising depositing the conductive interconnects through screen printing conductive forms of ink on the sputter deposited barrier metal layer.

14. The method of claim 8, comprising:
depositing a moisture barrier thin film on the formed thin-film based thermoelectric module prior to the encapsulation thereof with the elastomer; and
providing the encapsulation through the elastomer around the deposited moisture barrier thin film.

15. A method of a thin-film based thermoelectric device comprising:
forming the thin-film based thermoelectric device out of an array of thermoelectric modules, each of which is less than or equal to 100 µm in dimensional thickness and is formed by sputter depositing pairs of N-type thermoelectric legs and P-type thermoelectric legs electrically in contact with one another on corresponding electrically conductive pads on a flexible substrate such that an area of each sputter deposited N-type thermoelectric leg and another area of each sputter deposited P-type thermoelectric leg is more than an area of the corresponding electrically conductive pad to allow for extension thereof outside the corresponding electrically conductive pad, the flexible substrate being one of: Al foil, a sheet of paper, teflon, plastic, a single-sided Cu clad laminate sheet, and a double-sided Cu clad laminate sheet, the flexible substrate having a dimensional thickness less than or equal to 25 µm, and a layer of the each thermoelectric module including the sputter deposited N-type thermoelectric legs and the P-type thermoelectric legs having a dimensional thickness less than or equal to 25 µm;
rendering the formed thin-film based thermoelectric device flexible based on choices of fabrication processes with respect to layers of the each thermoelectric module including the sputter deposited N-type thermoelectric legs and the P-type thermoelectric legs; and
encapsulating the each thermoelectric module of the formed thin-film based thermoelectric device with an elastomer to render the flexibility thereto, the elastomer encapsulation having a dimensional thickness less than or equal to 15 µm, and the flexibility enabling the formed thin-film based thermoelectric device to be completely wrappable and bendable around a system element from which the formed thin-film based thermoelectric device is configured to derive thermoelectric power.

16. The method of claim 15, comprising utilizing one of: a photomask and a hard mask with patterns corresponding to one of: the N-type thermoelectric legs and the P-type thermoelectric legs to aid the sputter deposition thereof.

17. The method of claim 15, further comprising printing and etching a design pattern of metal onto the flexible substrate to form the corresponding electrically conductive pads.

18. The method of claim 17, further comprising sputter depositing a barrier metal layer comprising one of: Cr, Ni and Au on top of the sputter deposited pairs of the N-type thermoelectric legs and the P-type thermoelectric legs utilizing one of: another photomask and another hard mask to further aid metallization contact therewith.

19. The method of claim 18, further comprising depositing conductive interconnects on top of the sputter deposited barrier metal layer utilizing a hard mask to assist selective application thereof.

20. The method of claim 19, further comprising depositing the conductive interconnects through screen printing conductive forms of ink on the sputter deposited barrier metal layer.

* * * * *